United States Patent
Jin et al.

(10) Patent No.: US 10,795,193 B2
(45) Date of Patent: Oct. 6, 2020

(54) STRUCTURE OF SHIELD COVER AND DISPLAY DEVICE INCLUDING THE SAME

(71) Applicant: Samsung Display Co., Ltd., Yongin-si (KR)

(72) Inventors: Byoung Jin Jin, Yongin-si (KR); Seung Jae Kang, Asan-si (KR); Dong Jin Park, Gwangmyeong-si (KR); Jong Hyeon Choi, Pyeongtaek-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/360,666

(22) Filed: Mar. 21, 2019

(65) Prior Publication Data

US 2019/0353950 A1    Nov. 21, 2019

(30) Foreign Application Priority Data

May 18, 2018   (KR) ........................ 10-2018-0057120

(51) Int. Cl.
*G02F 1/1333*   (2006.01)
*H05K 5/00*   (2006.01)
(Continued)

(52) U.S. Cl.
CPC ....... *G02F 1/133308* (2013.01); *G02B 6/005* (2013.01); *G02B 6/0055* (2013.01);
(Continued)

(58) Field of Classification Search
CPC ...... H05K 5/0017; H05K 5/03; G02B 6/0055; G02B 6/0088
See application file for complete search history.

(56) References Cited

U.S. PATENT DOCUMENTS

2012/0327617 A1   12/2012   Maeyama
2018/0279514 A1*   9/2018   Maemuko ............ H05K 9/0026
2019/0204660 A1*   7/2019   Maemuko ............ G02B 6/0083

FOREIGN PATENT DOCUMENTS

EP           3 217 250       9/2017
KR    10-2007-0067896        6/2007
(Continued)

OTHER PUBLICATIONS

Extended European Search Report dated Oct. 29, 2019, in European Patent Application No. 19174993.6.

*Primary Examiner* — Joseph L Williams
(74) *Attorney, Agent, or Firm* — H. C. Park & Associates, PLC

(57) ABSTRACT

A display device includes a display module, a circuit board, and a shield cover. The display module includes a display panel. The circuit board is disposed under the display module and is connected to a first side of the display panel. The shield cover includes a body portion, a side portion, and a first support portion. The body portion is disposed under the circuit board. The side portion extends in an upward direction from a first side of the body portion along a first side surface of the display module, the first side surface of the display module being adjacent to the first side of the display panel. The first support portion protrudes in the upward direction from a second side of the body portion adjacent to the first side of the body portion, the first support portion contacting a lower surface of the display module.

30 Claims, 20 Drawing Sheets

(51) Int. Cl.
*H05K 1/14* (2006.01)
*H05K 5/03* (2006.01)
*F21V 8/00* (2006.01)

(52) U.S. Cl.
CPC ........... *G02B 6/0088* (2013.01); *H05K 1/148* (2013.01); *H05K 5/0017* (2013.01); *H05K 5/03* (2013.01); *G02F 2001/13332* (2013.01); *G02F 2001/133314* (2013.01); *H05K 2201/056* (2013.01); *H05K 2201/09063* (2013.01); *H05K 2201/10136* (2013.01); *H05K 2201/10409* (2013.01)

(56) References Cited

FOREIGN PATENT DOCUMENTS

| | | |
|---|---|---|
| KR | 10-2017-0050512 | 5/2017 |
| KR | 10-2017-0081153 | 7/2017 |
| KR | 10-1754288 | 7/2017 |

\* cited by examiner

FIG. 1
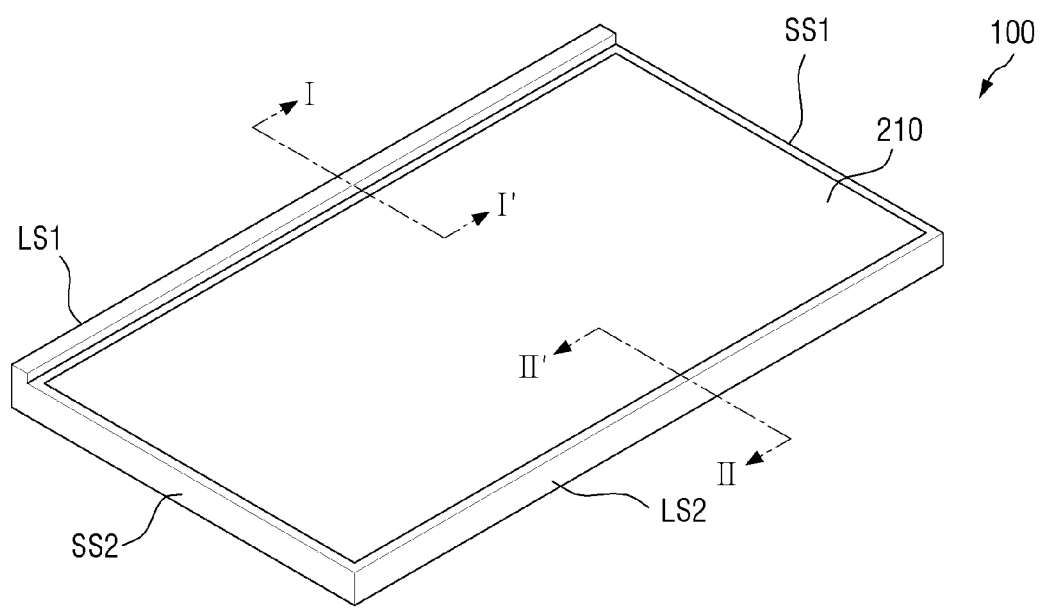
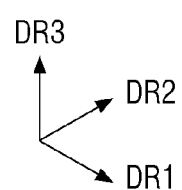

FIG. 17
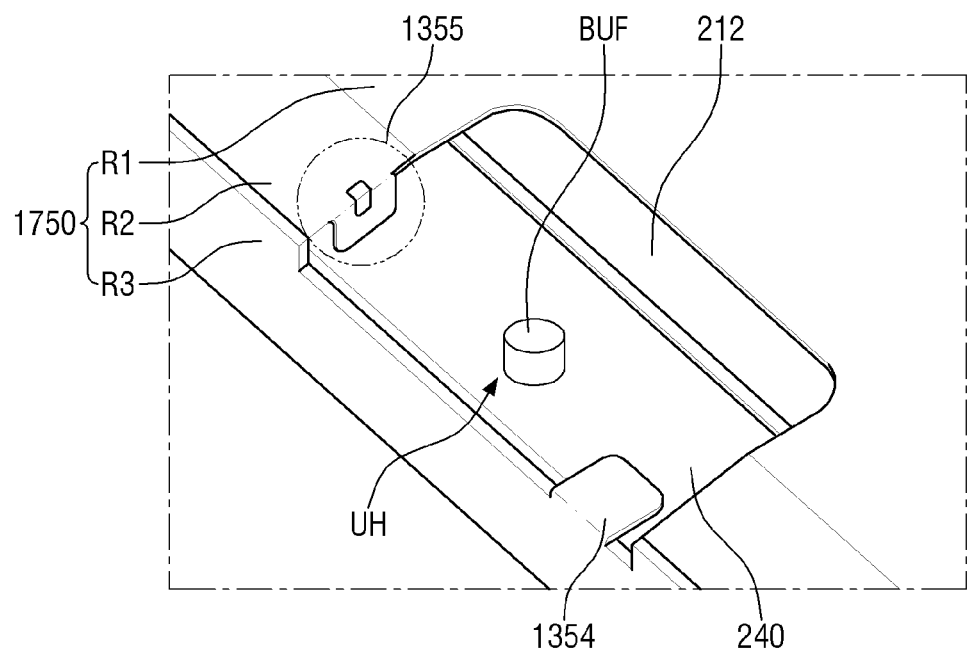
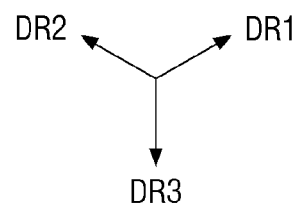

FIG. 18
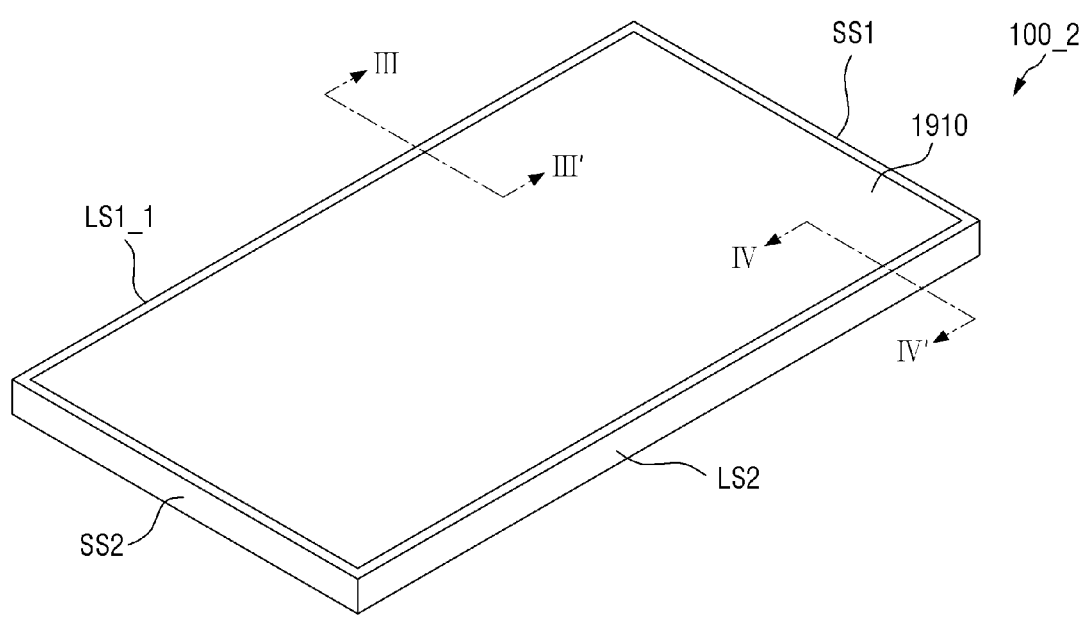
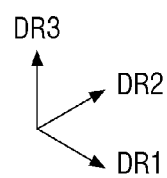

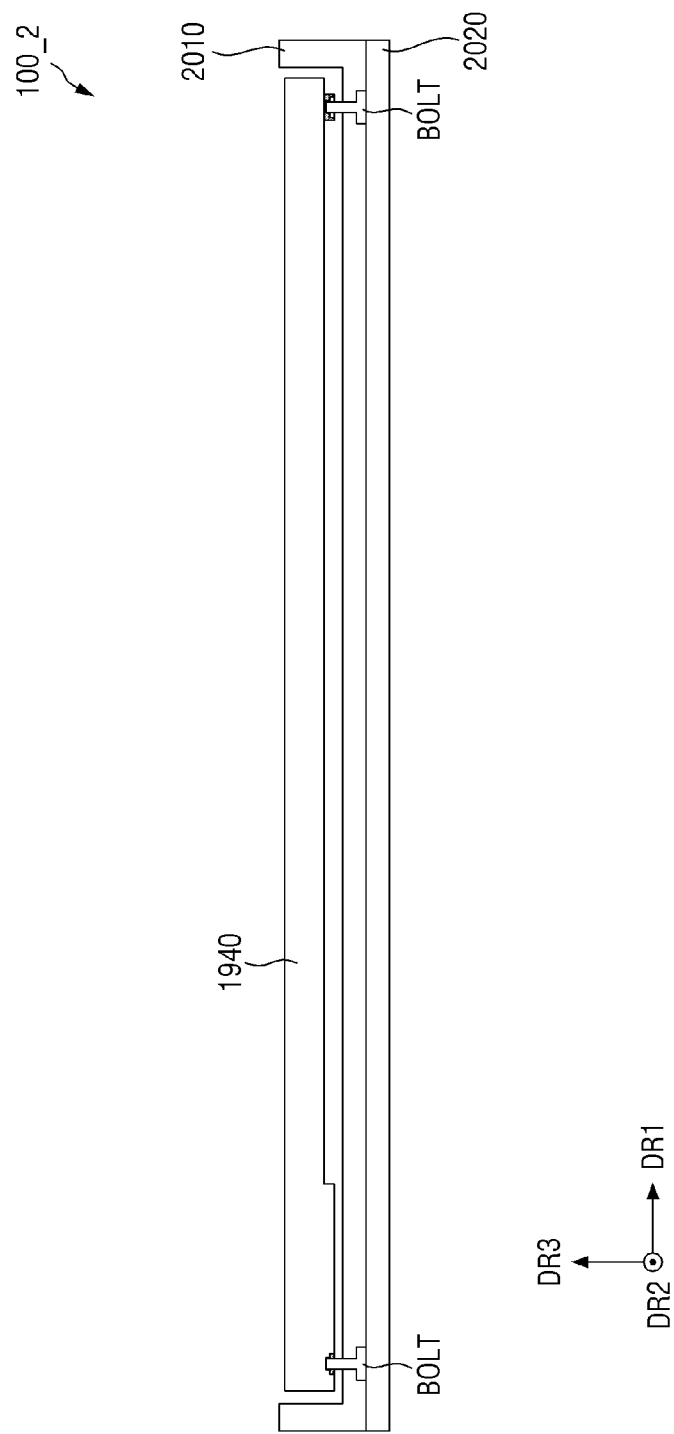

STRUCTURE OF SHIELD COVER AND DISPLAY DEVICE INCLUDING THE SAME

CROSS-REFERENCE TO RELATED APPLICATION

This application claims priority from and the benefit of Korean Patent Application No. 10-2018-0057120, filed May 18, 2018, which is hereby incorporated by reference for all purposes as if fully set forth herein.

BACKGROUND

Field

Exemplary embodiments generally relate to display technology, and more particularly, to a display device.

Discussion

A liquid crystal display typically includes thin-film transistors, a lower glass substrate having pixel electrodes, an upper glass substrate having a common electrode, liquid crystals filled between the upper and lower glass substrates, and a color filter for displaying color. Conventional liquid crystal displays cannot emit light themselves and display an image by controlling transmittance of light incident from the outside using the liquid crystals. Thus, a backlight unit may be used to provide the light. Backlight units are generally classified into direct-type and edge-type according to the position of a light source. In edge-type backlight units, the light source is disposed on at least one side of a light guide plate. In direct-type backlight units, the light source is disposed under the display. With the trend for lighter and thinner display devices, edge-type backlight units are drawing increasing amounts of attention.

The above information disclosed in this section is only for understanding the background of the inventive concepts, and, therefore, may contain information that does not form prior art.

SUMMARY

Some exemplary embodiments provide a display device capable of being made lighter in weight with improved product stability.

Additional aspects will be set forth in the detailed description which follows, and, in part, will be apparent from the disclosure, or may be learned by practice of the inventive concepts.

According to some exemplary embodiments, a display device includes a display module, a circuit board, and a shield cover. The display module includes a display panel. The circuit board is disposed under the display module and is connected to a first side of the display panel. The shield cover includes a body portion, a side portion, and a first support portion. The body portion is disposed under the circuit board such that the circuit board is disposed between the display panel and the body portion. The side portion extends in an upward direction from a first side of the body portion along a first side surface of the display module, the first side surface of the display module being adjacent to the first side of the display panel. The first support portion protrudes in the upward direction from a second side of the body portion adjacent to the first side of the body portion, the first support portion contacting a lower surface of the display module.

According to some exemplary embodiments, a display device includes a display module, a circuit board, and a shield cover. The display module includes a display panel. The circuit board is disposed under the display module and is connected to a first side of the display panel. The shield cover covers at least part of a first side of the display module and the circuit board. The shield cover includes a body portion, a side portion, a user hole, and a first support portion. The body portion is disposed under the circuit board such that the circuit board is disposed between the display panel and the body portion. The a side portion extends in an upward direction from a first side of the body portion along a first side surface of the display module, the first side surface of the display module being adjacent to the first side of the display panel. The user hole is adjacent to the side portion and partially exposes a lower surface of the display module. The first support portion protrudes in a horizontal direction from a first edge of the user hole, the first support portion contacting the lower surface of the display module. The horizontal direction is perpendicular to the upward direction. The first edge of the user hole is adjacent to the side portion and parallel to the side portion.

According to some exemplary embodiments, a display device includes a display module, a circuit board, and a shield cover. The display module includes a display panel. The circuit board is disposed under the display module and is connected to a first side of the display panel. The shield cover covers at least part of a first side of the display module and the circuit board. The shield cover includes a body portion, a side portion, a user hole, and a first support portion. The body portion is disposed under the circuit board such that the circuit board is disposed between the display panel and the body portion. The side portion extends in an upward direction from a first side of the body portion along a first side surface of the display module, the first side surface of the display module being adjacent to the first side of the display panel. The user hole is adjacent to the side portion and partially exposes a lower surface of the display module. The a first support portion protrudes in the upward direction from a first edge of the user hole, the first support portion contacting the lower surface of the display module. The first edge of the user hole is adjacent to the side portion and perpendicular to the side portion.

According to various exemplary embodiments, bezels of a display device can be minimized or at least reduced in size at three out of the four sides via an edge-type backlight unit. In addition, failure due, at least n part, to an external force and static electricity be prevented (or at least reduced) by covering a connection film and a circuit board with a shield cover. Further, product stability can be improved by supporting the shield cover at one or more (e.g., two) points on a housing (or a display module) by coupling portions, support portions, etc.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 1 is a perspective view of a display device according to some exemplary embodiments.

FIG. 17 illustrates another example of a shield cover according to some exemplary embodiments.

FIG. 18 is a perspective view of a display device according to some exemplary embodiments.

FIG. 20 is a cross-sectional view taken along sectional line IV-IV' of FIG. 18 according to some exemplary embodiments.

DETAILED DESCRIPTION OF THE ILLUSTRATED EMBODIMENTS

Figure 2:
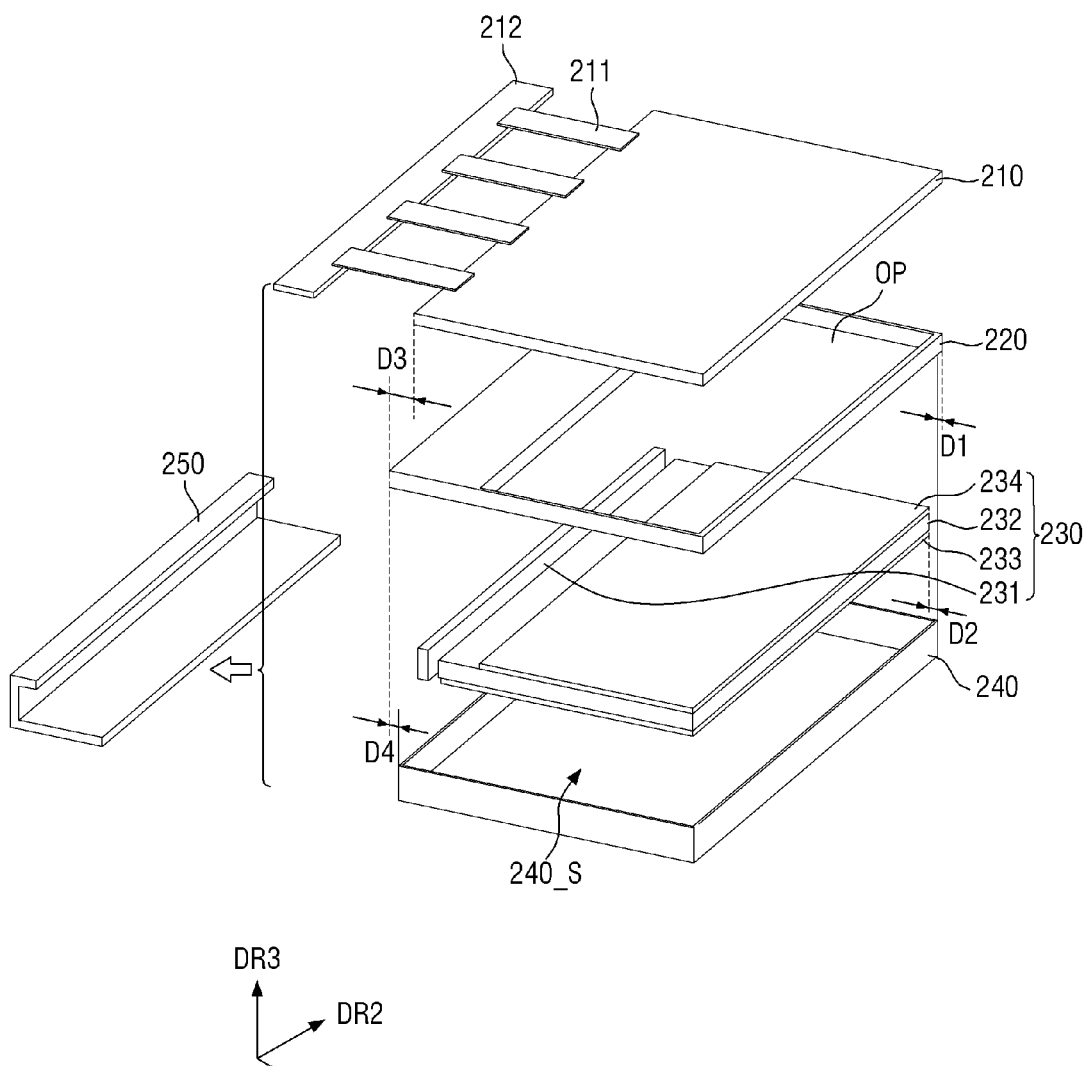
FIG. 2 is an exploded perspective view of the display device of FIG. 1 according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching, shading, and/or line weights in the accompanying drawings is generally provided to clarify boundaries between adjacent elements. As such, neither the presence nor the absence of cross-hatching, shading, or a given line weight conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. To this end, the DR1-axis, the DR2-axis, and the DR3-axis may be respectively referred to as a first direction DR1, a second direction DR2, and a third direction DR3. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 3:
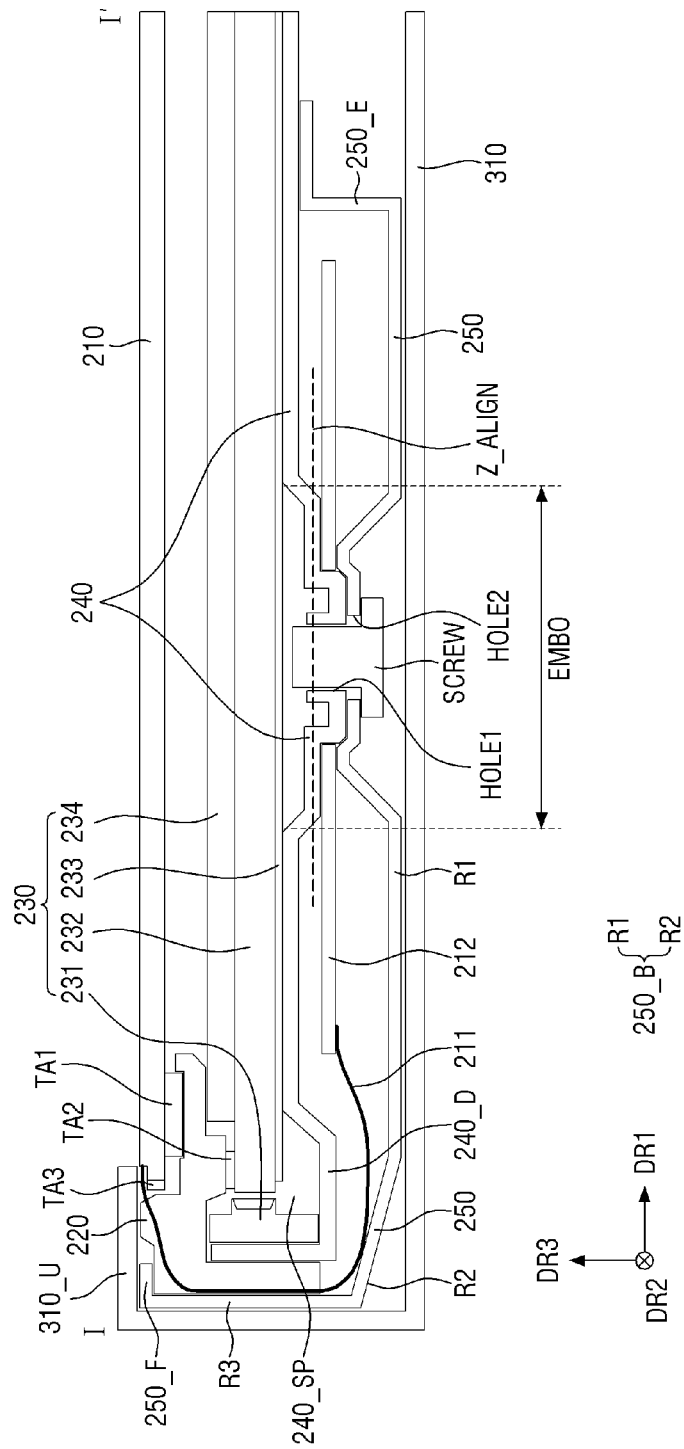
FIG. 3 is a cross-sectional view taken along sectional line I-I' of FIG. 1 according to some exemplary embodiments.
Figure 4:
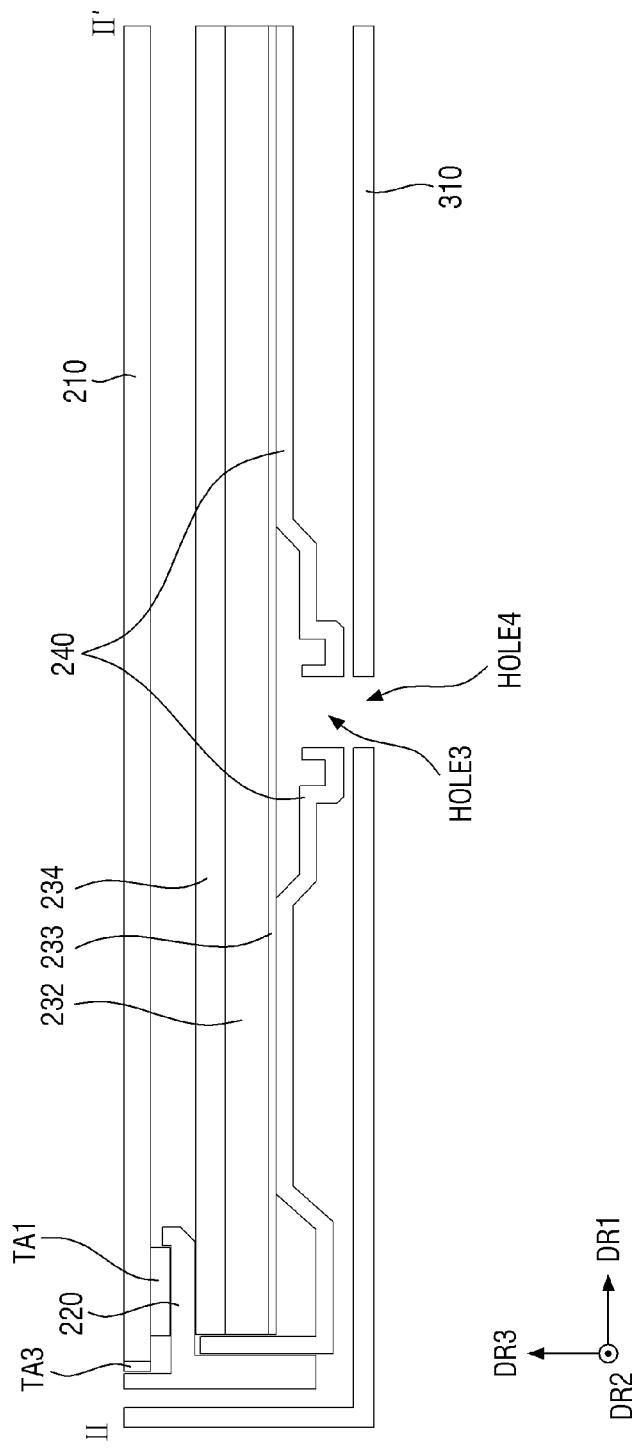
FIG. 4 is a cross-sectional view taken along sectional line II-II of FIG. 1 according to some exemplary embodiments.
Figure 5:
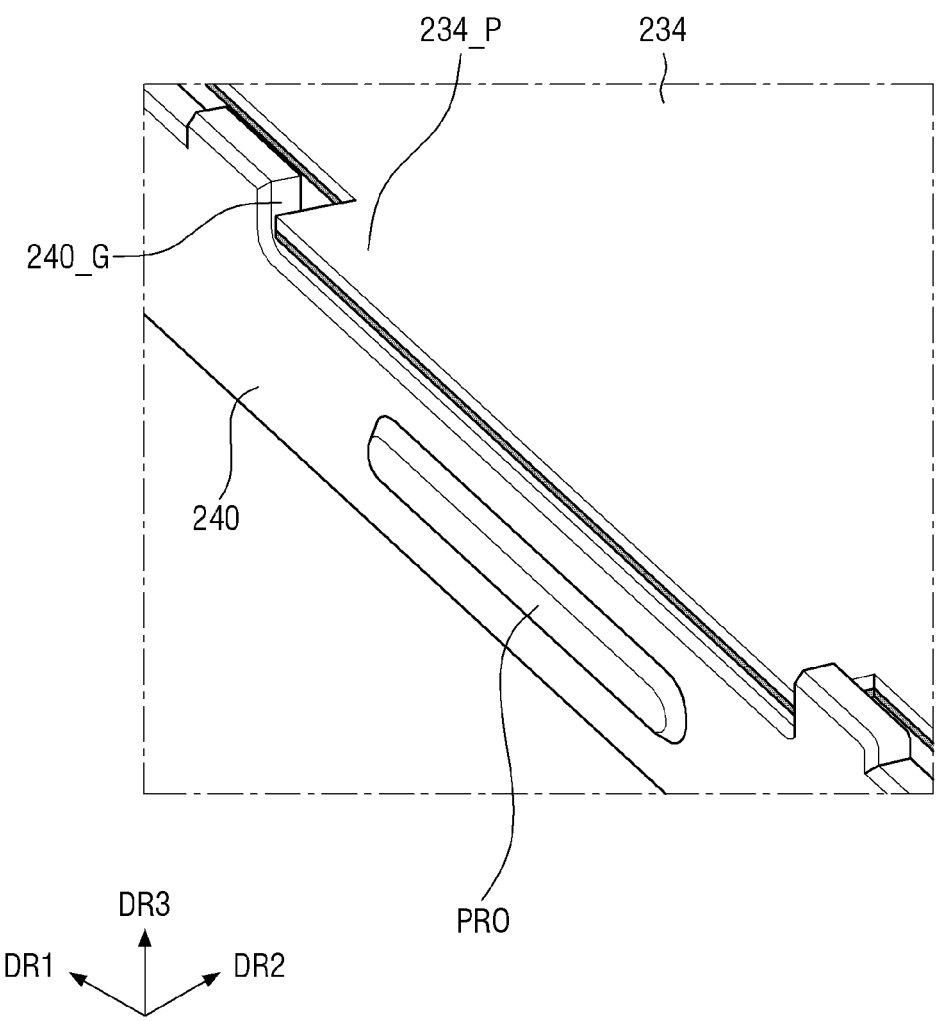
FIG. 5 is a perspective view of a housing and an optical sheet included in the display device of FIG. 1 according to some exemplary embodiments.
Figure 6:
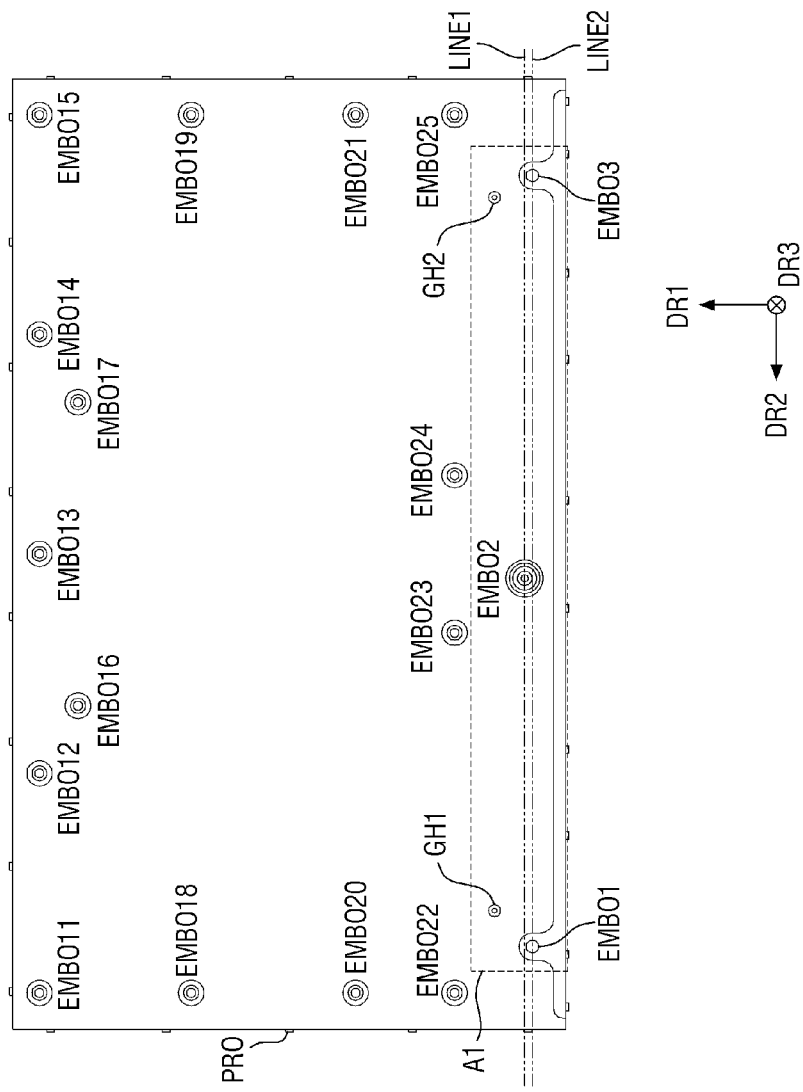
FIG. 6 is a bottom view of the housing included in the display device of FIG. 1 according to some exemplary embodiments.
Figure 7:
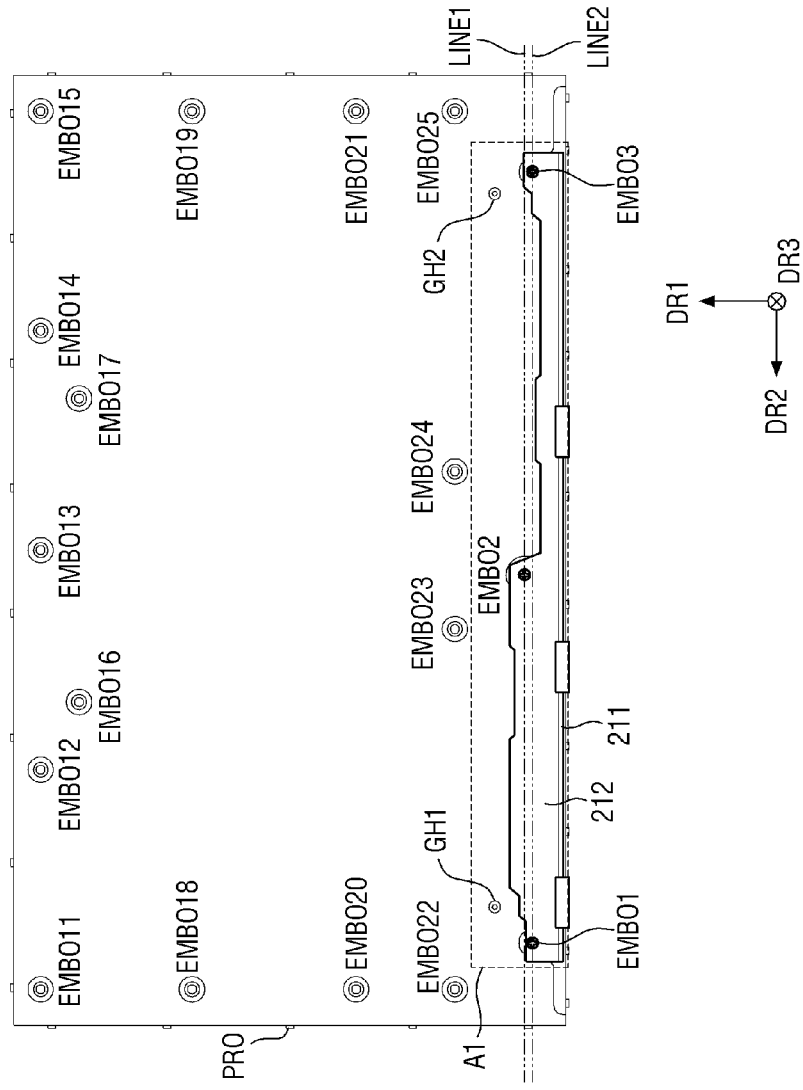
FIG. 7 is a bottom view of the housing to which a circuit board has been coupled according to some exemplary embodiments.
Figure 8:
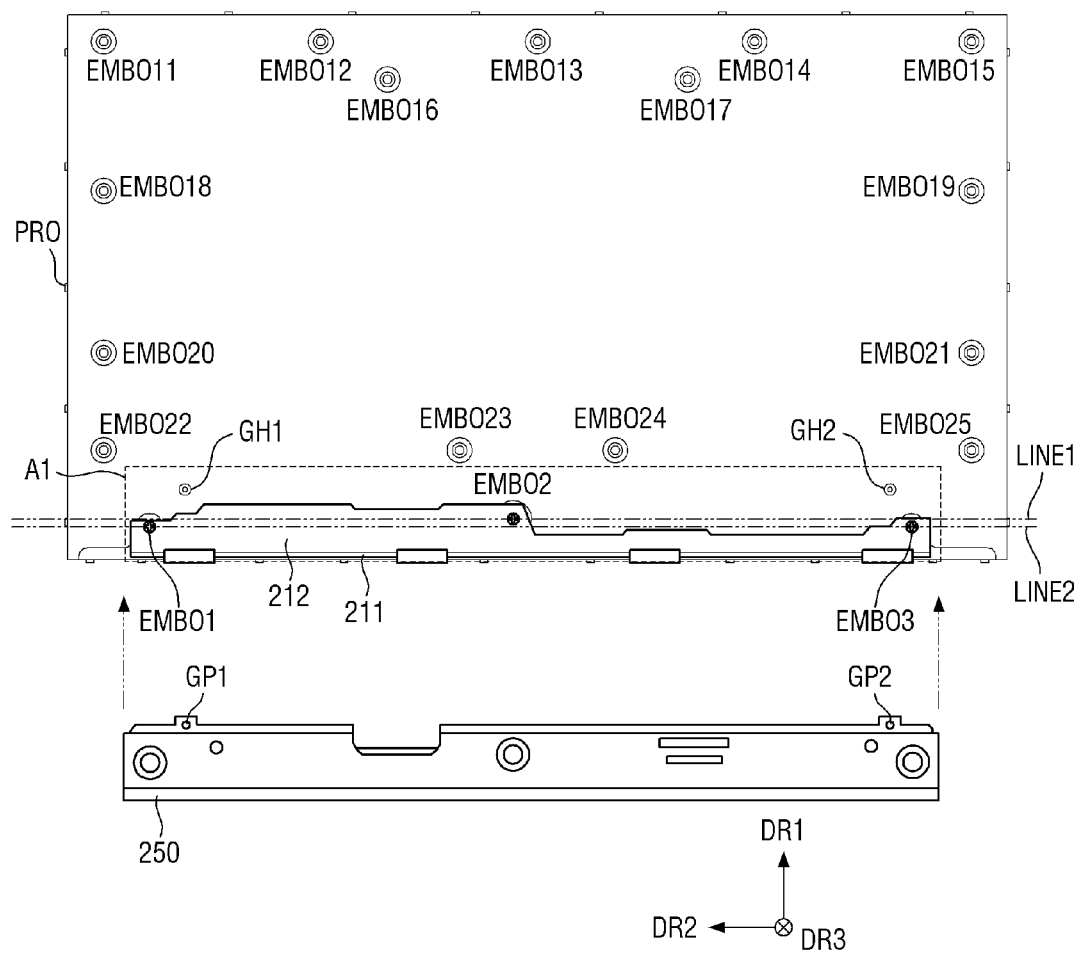
FIG. 8 is a bottom view of a shield cover included in the display device of FIG. 1 according to some exemplary embodiments.

FIG. 1 is a perspective view of a display device 100 according to some exemplary embodiments. FIG. 2 is an exploded perspective view of the display device 100 of FIG. 1 according to some exemplary embodiments. FIG. 3 is a cross-sectional view taken along sectional line I-I' of FIG. 1 according to some exemplary embodiments. FIG. 4 is a cross-sectional view taken along sectional line II-II' of FIG. 1 according to some exemplary embodiments. FIG. 5 is a perspective view of a housing 240 and an optical sheet 234 included in the display device 100 of FIG. 1 according to some exemplary embodiments. FIG. 6 is a bottom view of the housing 240 included in the display device 100 of FIG. 1 according to some exemplary embodiments. FIG. 7 is a bottom view of the housing 240 to which a circuit board 212 has been coupled according to some exemplary embodiments. FIG. 8 is a bottom view of a shield cover 250 included in the display device 100 of FIG. 1 according to some exemplary embodiments.

Referring to FIGS. 1 through 8, the display device 100 may have a substantially rectangular shape in a plan view, e.g., when viewed in the third direction DR3. The display device 100 may be shaped like a rectangle with right-angled corners in a plan view. However the shape of the display device 100 is not limited to this example, and the display device 100 may also be shaped like a rectangle with rounded corners in a plan view or shaped in any other suitable manner. The display device 100 may include four sides or edges. For instance, the display device 100 may include long sides LS1 and LS2 extending in the second direction DR2 and short sides SS1 and SS2 extending in the first direction DR1.

Unless otherwise defined, the terms "above," "above" "upper surface," and "upper side," as used herein, denote a display surface side of a display panel 210, and the terms "below," "lower surface," and "lower side," as used herein, denote an opposite side of the display panel 210 from the display surface side.

In FIG. 1, a long side located on a left side of the display device 100 will be referred to as a first long side LS1, a long side located on a right side of the display device 100 will be referred to as a second long side LS2, a short side located on an upper side of the display device 100 will be referred to as a first short side SS1, and a short side located on a lower side of the display device 100 will be referred to as a second short side SS2.

As illustrated in FIG. 1, the display device 100 may include a thicker bezel at the first long side LS1 than at the other sides (e.g., the first short side SS1, the second short side SS2 and the second long side LS2) of the display device 100. For descriptive convenience, the other sides will be referred to as "the other sides SS1, SS2, and LS2." The thicknesses (or widths) of the bezels at the other sides SS1, SS2 and LS2 may be substantially equal to each other. For example, the widths of the bezels at the other sides SS1, SS2 and LS2 may be equal or similar to the thickness of a case 310 to be described later. Meanwhile, the widths of the bezels at the other sides SS1, SS2 and LS2 may be substantially equal to the thickness of the case 310 to be described later. That is, bezels may hardly exist at the other sides (e.g., three sides) SS1, SS2 and LS2 from among the four sides (e.g., the first long side LS1, the second long side LS2, the first short side SS1 and the second short side SS2) of the display device 100. However, exemplary embodiments are not limited to this case. For instance, the display device 100 may hardly include bezels at the four sides, e.g., the first long side LS1, the second long side LS2, the first short side SS1, and the second short side SS2, of the display device 100. This will be described later with reference to FIG. 13.

An upper surface of the display device 100 at the first long side LS1 may protrude above the upper surface of the display device 100 at the other sides SS1, SS2 and LS2. That is, the bezel at the first long side LS1 may protrude further in the third direction DR3 than the other bezels at the other sides SS1, SS2, and LS2. As will be described later, the case 310 may protrude at the first long side LS1 of the display device 100 and cover internal elements (for example, a frame 220) to prevent the internal elements from being exposed to the outside.

The display device 100 may include the display panel 210, the frame 220 (or a mold frame), a backlight unit 230, the housing 240 (or a bottom chassis), and the shield cover 250 (or a shield case). In addition, the display device 100 may further include a connection film 211 and the circuit board 212 connected to the display panel 210. Also, the display device 100 may further include the case 310.

In a manufacturing process of the display device 100, the backlight unit 230 may be accommodated in the housing 240. Then, the frame 220 may be placed on the housing 240 or may cover an upper surface (and side surfaces) of the housing 240. The display panel 210 may be placed on the frame 220. At this stage of manufacture, the resultant structure will be referred to as a display module. Next, the shield cover 250 may be coupled to one side (e.g., the first long side LS1) of the display module (e.g., the structure in Which the display panel 210, the frame 220, the backlight unit 230, and the housing 240 are sequentially stacked), and the display module to which the shield cover 250 is coupled may be inserted into the case 310.

The backlight unit 230, the housing 240, the frame 220, the display panel 210, the shield cover 250, and the case 310 will, hereinafter, be sequentially described according to the manufacturing order (or the placing order or the coupling order) of the display device 100.

The backlight unit 230 may generate light. The backlight unit 230 may include a light source 231, a reflective sheet 233, a light guide plate 232, and the optical sheet 234.

The light guide plate 232 may guide or lead a path of incident light. The light guide plate 232 may generally have a polygonal columnar shape; however, exemplary embodiments are not limited thereto. The planar shape of the light guide plate 232 may be, but is not limited to, a rectangular shape. For example, the light guide plate 232 may have a rectangular planar shape and may include an upper surface, a lower surface, and four side surfaces.

The light guide plate 232 may include an inorganic material. For example, the light guide plate 232 may be made of glass.

The light source 231 may generate light. As illustrated in FIGS. 2 and 3, the light source 231 may be disposed adjacent one side surface of the light guide plate 232, and light emitted from the light source 231 may enter the side surface of the light guide plate 232.

The overall shape of the light source 231 may be a quadrilateral columnar shape. The length of the light source 231 from an upper side to a lower side may be equal to or smaller than the length of one side surface (e.g., a side surface at the first long side LS1) of the light guide plate 232, and the width of the light source 231 from a left side to a right side may be much smaller than the length of the light source 231. That is, the light source 231 may be shaped like a rod extending in a longitudinal direction, e.g., extending in the second direction DR2.

Although not shown, the light source 231 may include a plurality of light emitting diode (LED) light sources, and the LED light sources may be arranged on one side surface of the light source 231 (e.g., a side surface adjacent to the side surface of the light guide plate 232) along the longitudinal direction (e.g., the longitudinal direction from the upper side to the lower side of the display device 100).

The light source 231 may be spaced apart from the light guide plate 232 by a predetermined distance. In this case, the light guide plate 232 can be prevented from being damaged by heat generated from the light source 231.

The light source 231 may have a height (e.g., a height in an up-down direction, e.g., a height in the third direction DR3) greater than the height (or thickness) of the light guide plate 232. Since the light source 231 is formed relatively long in the up-down direction (or a vertical direction, e.g., the third direction DR3), a bezel (or a dead space in which no image is displayed) at one side of the display device 100 can be reduced.

The reflective sheet 233 may be disposed on the lower surface of the light guide plate 232. The reflective sheet 233 may, like the light guide plate 232, have a quadrilateral planar shape and may have a size equal or similar to the size (or area, e.g., surface area) of the light guide plate 232. Exemplary embodiments, however, are not limited thereto, and the reflective sheet 233 may be configured in any suitable manner. The reflective sheet 233 may be disposed between the light guide plate 232 and the housing 240 (or a bottom surface (e.g., an inner bottom surface) of the housing 240) to be described later.

The reflective sheet 233 may include a reflective film or a reflective coating layer. The reflective sheet 233 may reflect light emitted downward from the light guide plate 232 back into the light guide plate 232. The reflectance of the reflective sheet 233 (or the density of a reflective material contained in the reflective sheet 233) may decrease as the distance from the light source 231 decreases and may increase as the distance from the light source 231 increases.

The optical sheet 234 may be disposed on the upper surface of the light guide plate 232. The optical sheet 234 may have a generally quadrilateral planar shape; however, exemplary embodiments are not limited thereto.

Although not shown, the optical sheet 234 may include one or more optical films (or sheets), and the optical films may include, for instance, at least one of a prism sheet, a diffusion sheet, a micro-lens sheet, a lenticular sheet, a polarizing sheet, a reflective polarizing sheet, and a retardation sheet.

The optical sheet 234 may be kept separate from the light guide plate 232 without being coupled (or attached) to the light guide plate 232.

As illustrated in FIG. 5, the optical sheet 234 may include a plurality of projections 234_P protruding outward from edges (e.g., outward from the center of gravity in a plan view or outward from a central area of the optical sheet 234 in a plan view), and the projections 234_P of the optical sheet 234 may be caught on (or interface with) grooves 240_G formed along edges of the housing 240. Here, the protruding length of the projections 234_P of the optical sheet 234 may be equal or similar to a thickness D2 of the housing 240 (or sidewalls of the housing 240). The grooves 240_G of the housing 240 may be depressed portions of an uneven shape formed in the sidewalls of the housing 240 in the up-down direction, e.g., the third direction DR3.

Although the backlight unit 230 has been described as an edge-type backlight unit, it is not limited to the edge-type. The backlight unit 230 may also be a direct-type backlight unit in which a light source is disposed under a display panel, such as display panel 210, with respect to, for instance, the third direction DR3.

The backlight unit 230 may be housed (or otherwise supported) in the housing 240. For instance, the housing 240 may include a bottom having a quadrilateral planar shape and the sidewalls extending upward from edges of the bottom. A housing space (or inner cavity region) 240_S may be formed or defined by the bottom and the sidewalls of the housing 240, and the backlight unit 230 may be housed in the housing space 240_S of the housing 240.

The sidewalls of the housing 240 may have a sufficient or predetermined height. In this case, the backlight unit 230 housed in the housing space 240_S of the housing 240 may not be exposed at the sides by the housing 240. However, the housing 240 is not limited to the aforementioned example. For example, the backlight unit 230 may protrude above the sidewalls of the housing 240 at the sides.

As illustrated in FIGS. 3 and 6, a portion 240_D (e.g., an edge portion at the first long side LS1) of the bottom of the housing 240 may protrude downward with respect to, for example, the third direction DR3 (e.g., in a direction towards case 310), and the light source 231 having a relatively large height may be disposed inside an increased area 240_SP of the housing space 240_S created by the portion 240_D of the bottom of the housing 240.

Coupling portions EMBO may be formed in a lower surface of the housing 240 (or a lower surface of the bottom of the housing 240). As illustrated in FIG. 6, first through third coupling portions EMBO1 through EMBO3 and eleventh through twenty-fifth coupling portions EMBO11 through EMBO25 may be formed in the lower surface of the housing 240. For ease of description, the first through third coupling portions EMBO1 through EMBO3 and the eleventh through twenty-fifth coupling portions EMBO11 through EMBO25 will be referred to as the coupling portions EMBO when their common features are described.

Each of the coupling portions EMBO has a circular planar shape and includes a first hole HOLE1 (or a third hole HOLE3) at its center. In cross-sectional view, the coupling portions EMBO may protrude downward in a stepped shape from the bottom of the housing 240. For instance, the coupling portions EMBO may protrude downward in the third direction DR3 towards the case 310.

Coupling members (e.g., coupling member SCREW) (e.g., bolts) may be inserted into the first hole HOLE1 of each of the first through third coupling portions EMBO1 through EBMO3, respectively. The shield cover 250 and the circuit board 212 (that will be described later) may be fixed to the lower surface of the housing 240 by the coupling members, e.g., coupling member SCREW.

The first through third coupling portions EMBO1 through EMBO3 are located in a first area A1 of the display device 100. The first coupling portion EMBO1 and the third coupling portion EMBO3 may be respectively located adjacent to the first and second short sides SS1 and SS2 of the display device 100. The second coupling portion EMBO2 may be located between the first and third coupling portions EMBO1 and EMBO3. Here, the first area A1 may be an area where the circuit board 212 and the shield cover 250 (that will be described later) are disposed or coupled.

In addition, the first through third coupling portions EMBO1 through EMBO3 may be disposed on the same line or may respectively be disposed on different lines parallel to each other. As illustrated in FIG. 6, the first coupling portion EMBO1 and the third coupling portion EMBO3 may be disposed on a second line LINE2, and the second coupling portion EBMO2 may be disposed on a second line LINE2. In this case, the first through third coupling portions EMBO1 through EMBO3 may fix or support the shield cover 250 and/or the circuit board 212 at two points (or two lines) along the extending direction of the first short side SS1.

Similarly, the eleventh through twenty-fifth coupling portions EMBO11 through EMBO25 may be distributed (e.g., evenly distributed) on the lower surface of the housing 240 and adjacent to edges of the lower surface of the housing 240.

Coupling members (e.g., a bolt) may be inserted into the third hole HOLE3 of each of the eleventh through twenty-fifth coupling portions EMBO11 through EMBO25, respectively, and the housing 240 may be coupled to the case 310 (which will be described later) by the coupling members.

First and second guide holes GH1 and GH2 may be formed in the lower surface of the housing 240 (or in the first area A1 of the lower surface of the housing 240). First and second guide pins GP1 and GP2 of the shield cover 250 to be described later may be disposed in the first and second guide holes GH1 and GH2 to adjust (or align) the position of the shield cover 250 in a horizontal direction.

Referring again to FIGS. 2 and 3, the frame 220 may be disposed on the backlight unit 230 and the housing 240, and may cover part of the upper surface of the housing 240 and at least part of the side surfaces of the housing 240. The frame 220 may have a quadrilateral planar shape and include sidewalls extending downward from its edges; however, exemplary embodiments are not limited thereto. The frame 220 may have a size larger than the size of the housing 240 by first and fourth thicknesses (or width) D1 and D4 of the sidewalls. At least part of an inner surface of the frame 220 may contact an outer surface of the housing 240.

As illustrated in FIGS. 5 and 6, when protrusions PRO are formed on the outer surface of the housing 240, the inner surface of the frame 220 may contact the protrusions PRO, and the housing 240 may be fitted to the inner surface of the frame 220 by the protrusions PRO.

The frame 220 includes a hole OP (or an opening) at its center or a central portion of the frame 220. The hole OP may have a generally quadrilateral planar shape, may be relatively spaced apart from the first long side LS1, and may be adjacent to the second long side LS2; however, exemplary embodiments are not limited thereto. Depending on the position of the hole OP in the frame 220, the frame 220 may have a generally constant thickness (or width) at the first short side SS1, the second long side LS2, and the second short side SS2, but may have a greater thickness at the first long side LS1 than at the other sides LS2, SS1 and SS2. The frame 220 may cover the light source 231 of the backlight unit 230 at the first long side LS1.

The size (or the area in a plan view) of the hole OP may be smaller than the size of the optical sheet 234 of the backlight unit 230. When the center of the area of the optical sheet 234 coincides with the center of the area of the hole OP, the edges of the optical sheet 234 may be located between the frame 220 and the light guide plate 232, and the optical sheet 234 may be fixed by the frame 220 and the light guide plate 232 in the up-down direction (or the vertical direction), e.g., in the third direction DR3.

A second support member TA2 may be disposed between the frame 220 and a portion (e.g., an edge portion of the upper surface) of the light guide plate 232 exposed by the optical sheet 234. The second support member TA2 may be attached to a lower surface of the frame 220 by an adhesive or the like and may not be coupled to the light guide plate 232 (that is, may be kept separate from the light guide plate 232). The second support member TA2 may have a thickness equal to or smaller than the thickness of the optical sheet 234 and prevent or mitigate the transmission of an impact between the frame 220 and the light guide plate 232. When the second support member TA2 has a thickness smaller than that of the optical sheet 234, a portion of the lower surface of the frame 220 may protrude downward to correspond to the second support member TA2. In this case, an edge portion of the optical sheet 234 that is overlapped by the frame 220 can be prevented from being pressed.

In FIG. 2, the frame 220 is illustrated as a single piece; however, the frame 220 is not limited to this structure. For example, the frame 220 may consist of multiple (e.g., four) fixing members respectively corresponding to sides (e.g., four sides) and independent of each other. As another example, the frame 220 may consist of eight fixing members corresponding to four sides and four corners of the frame 220.

The display panel 210 may be disposed on the frame 220.

The display panel 210 may be a panel for displaying an image. For example, the display panel 210 may be a liquid crystal display panel. For descriptive convenience, a flat display device including a liquid crystal display panel is exemplified; however, exemplary embodiments are not limited to the liquid crystal display panel, and other types of display panels, such as an electro-wetting display panel, an electrophoretic display panel, and a micro-electro mechanical system display panel, etc., can also be applied.

The display panel 210 may have a size similar to the size (or area) of the light guide plate 232 of the backlight unit 230. In addition, the display panel 210 may be larger than the hole OP of the frame 220 and may completely cover an upper surface of the backlight unit 230 exposed by the frame 220 (or the hole OP of the frame 220).

A first support member TA1 may be disposed between the display panel 210 and the frame 220. The first support member TA1 may be disposed along edges of the display panel 210 and may not overlap the upper surface of the backlight unit 230 exposed by the hole OP of the frame 220. For example, the first support member TA1 may be implemented as a double-sided adhesive tape and attached to each of a lower surface of the display panel 210 and an upper surface of the frame 220. The display panel 210 and frame 220 may be coupled to each other by the first support member TA1.

In addition, a third support member TA3 (e.g., an adhesive member, a sticky member, or the like) may be disposed on side surfaces of the display panel 210 along the side surfaces of the display panel 210. The third support member TA3 may be disposed between a portion protruding from the upper surface of the frame 220 along edges of the frame 220 and the side surfaces of the display panel 210 and may connect the display panel 210 to the frame 220. In this case, the space between the side surfaces of the display panel 210 and the frame 220 may be sealed by the support member TA3, and thus, may prevent the leakage of light through the side surfaces of the display panel 210.

One side (e.g., the first long side SS1) of the display panel 210 may be connected to the circuit board 212 by the connection film 211. As illustrated in FIGS. 2 and 3, when the display panel 210 has a top emission structure, a pad portion (e.g., a pad portion in which pads for connecting internal wirings to an external device are disposed) may be disposed on an upper surface of the display panel 210. An end of the connection film 211 may be attached to the upper surface of one side (e.g., the pad portion) of the display panel 210, and the other end of the connection film 211 may be attached to the circuit board 212. The connection film 211 may be connected to the display panel 210 and the circuit board 212 by an anisotropic conductive film (ACF), an ultrasonic bonding technique, or the like.

The connection film 211 may include a plurality of sub-connection films (e.g., four sub-connection films), and the sub-connection films may be spaced apart from each other along the extending direction of the first long side LS1 of the display device 100. However, the connection film 211 is not limited to the aforementioned example and may include holes formed in spaces between the sub-connection films.

The circuit board 212 may be a printed circuit board and may include circuitry that generates signals for driving the display panel 210.

After the display panel 210, the frame 220, the backlight unit 230, and the housing 240 are coupled to each other, the connection film 211 may be bent downward from the display panel 210. In this case, the circuit board 212 may be disposed under the housing 240 to overlap the display panel 210. As illustrated in FIG. 7, the circuit board 212 may be disposed in the first area A1 of the lower surface of the housing 240. In addition, the circuit board 212 may include holes corresponding to each first hole HOLE1 of the first through third coupling portions EMBO1 through EMBO3 of the housing 240.

The frame 220 may include concave portions corresponding to the connection film 211 (which may be bent), and the connection film 211 may be disposed in the concave portions of the frame 220. For example, the concave portions of the frame 220 may extend from the upper surface of the frame 220 to the lower surface along a side surface, and the depth of the concave portions may be equal to or greater than the thickness of the connection film 211. In this case, as illustrated in FIG. 3, the bent portion of the connection film 211 may overlap the frame 220 in cross-sectional view. That is, an outer surface of the connection film 211 may lie in the same plane as an outer surface of the frame 220 or may be located inside the outer surface of the frame 220. Therefore, an increase in bezel (or dead space) as a result of the connection film 211 can be prevented.

The shield cover 250 may be L-shaped in a cross-sectional view and may cover one side surface of the frame 220 and the lower surface of the housing 240 (or the first area A1 of the lower surface of the housing 240) at the first long side LS1 of the display device 100. In this manner, the shield cover 250 may cover the connection film 211 and the circuit board 212 from the outside and prevent the connection film 211 and the circuit board 212 from being exposed to the outside. The shield cover 250 may have certain rigidity and prevent the connection film 211 and the circuit board 212 from being damaged by an external force, such as an external impact. In addition, the shield cover 250 may include a conductive layer (not shown) to protect the connection film 211 and the circuit board 212 from static electricity.

As illustrated in FIG. 3, the shield cover 250 may include a body portion (or a body area) 250_B and a side part (or a side area) R3. The body portion 250_B may be located under the housing 240 (or the circuit board 212), and the side portion R3 may be located adjacent to one side surface of the frame 220 (or the display module). The side portion R3 may extend upward from one side of the body portion 250_B along one side surface of the display module.

The body portion 250_B may include a bottom portion (or a bottom area) R1 and an inclined portion (or an inclined area) R2.

The bottom portion R1 of the shield cover 250 may have a plate shape substantially parallel to the display panel 210. Coupling portions corresponding to the coupling portions EMBO of the housing 240 (or the first through third coupling portions EMBO1 through EMBO3) may be formed in the bottom portion R1 of the shield cover 250. Each of the coupling portions of the shield cover 250, like the coupling portions EMBO of the housing 240, may have a circular planar shape, may have a second hole HOLE2 at its center, and may protrude upward from the bottom portion R1 of the shield cover 250 in a cross-sectional view. The second hole HOLE2 may have a diameter equal to or greater than the diameter of the first hole HOLE1 of each coupling portion EMBO of the housing 240, and the center of the second hole HOLE2 may coincide with the center of the first hole HOLE1. As described above, the circuit board 212 may be disposed between the coupling portions of the shield cover 250 and the coupling portions EMBO of the housing 240. The shield cover 250 and, also, the circuit board 212 may be fixed to the housing 240 by the coupling members (e.g., coupling member SCREW) passing through the first and second holes HOLE1 and HOLE2.

Holes formed in the circuit board 212 may be larger than the first holes HOLE1 of the housing 240. In this case, at least part of each coupling portion EMBO of the housing 240 may protrude downward through a corresponding hole of the circuit board 212. Therefore, the circuit board 212 may be fixed (or temporarily fixed) by the coupling portions EMBO of the housing 240 even before the insertion of the coupling members, such as coupling member SCREW. When the second holes (e.g., second hole HOLE2) of the shield cover 250 are smaller than the holes of the circuit board 212, each coupling portion of the shield cover 250 may partially contact a corresponding coupling portion EMBO of the housing 240.

The inclined portion R2 may extend from one side (e.g., a side adjacent to the first long side LS1 of the display device 100) of the bottom portion R1 of the shield cover 250 in a diagonal direction that forms an obtuse angle with the bottom portion R1. The side portion R3 of the shield cover 250 may extend from one side of the inclined portion R2 toward an upper side of the display device 100 (e.g., in a direction perpendicular to the bottom portion of the shield cover 250, such as in the third direction DR3). An inner surface of the side portion R3 of the shield cover 250 may contact the outer surface of the frame 220. Since the shield cover 250 includes the inclined portion R2, it can be easily coupled to the case 310 which will be described later. For example, when one side of the case 310 has a "C" shape in a cross-sectional view, a portion (e.g., a portion where the shield cover 250 is located) of the display device 100 excluding the case 310 may first be inserted into the side of the case 310 by tilting the display device 100, and then the remaining portion of the display device 100 may be inserted into the case 310.

The length (e.g., the length in the horizontal direction in the cross-sectional view of FIG. 3) of the inclined portion R2 of the shield cover 250 may be equal or similar to the length of an upper cover portion (e.g., a portion of an upper surface of the case 310 that is exposed on a front surface of the display device 100), and an inclination angle of the inclined portion R2 of the shield cover 250 (e.g., an acute angle formed by the inclined portion R2 with respect to the bottom portion R1 of the shield cover 250) may be determined by the total thickness of the display device 100 and the length of the upper cover portion of the case 310. For example, the greater the length of the upper cover portion of the case 310, the smaller the inclination angle of the inclined portion R2 of the shield cover 250.

An upper end of the side portion R3 of the shield cover 250 may extend to the upper surface of the display panel 210.

In addition, the shield cover 250 may further include a fixing portion (or a cover area) 250_F. The fixing portion 250_F may protrude from the upper end of the side portion R3 of the shield cover 250 toward the display panel 210 or may be formed by bending the upper end of the side portion R3 of the shield cover 250 toward the display panel 210. The fixing portion 250_F of the shield cover 250 may be disposed on the upper surface of the frame 220. In this case, the shield cover 250 can be prevented from being displaced downward from the frame 220 by an external force applied downward onto the shield cover 250.

The shield cover 250 may further include a support portion protruding from the inclined portion R2 and/or the side portion R3. The support portion may keep the housing 240 and the shield cover 250 spaced apart from each other by a predetermined distance at the first long side LS1 of the display device 100 and prevent the movement of the shield cover 250 in the up-down direction (e.g., the vertical direction, such as the third direction DR3). The structure of the support portion will be described later with reference to FIGS. 9 through 12.

When the shield cover 250 is supported at one point (or one line) on the housing 240 by the coupling member SCREW, the side portion R3 of the shield cover 250 can be moved in the up-down direction, e.g., in the third direction DR3. Even when the shield cover 250 is supported at two points (or two lines) along the first and second lines LINE1 and LINE2 as illustrated in FIG. 6, the side portion R3 of the shield cover 250 can be moved in the up-down direction, or the shield cover 250 can be distorted because the first and second lines LINE1 and LINE2 are relatively adjacent to each other. In addition, a surface (or an alignment axis Z_ALIGN) formed by the contact between each coupling portion EMBO of the housing 240 and a corresponding coupling portion of the shield cover 250 can be twisted or tilted with respect to the lower surface of the display panel 210. In this case, the side portion R3 of the shield cover 250 may protrude above the upper surface of the display panel 210, and the case 310 may also protrude upward.

The other end 250_E of the shield cover 250 (e.g., an end adjacent to the center of the display device 100) may be bent in an "L" shape to contact the lower surface of the housing 240 and may be fixed by the first and second guide pins GP1 and GP2. Accordingly, the movement of the other end 250_E of the shield cover 250 can be partially prevented. However, fixing only the other end of the shield cover 250 may be insufficient to prevent the movement of one end of the shield cover 250 (e.g., the side portion R3 of the shield cover 250).

According to various exemplary embodiments, the movement of the shield cover 250 (e.g., in the up-down direction, such as in the third direction DR3) at the side portion R3 of the shield cover 250 may be prevented by a support member protruding inward from the inclined portion R2 or the side portion R3 to contact (or support) the housing 240.

The case 310, which is shaped to correspond to the shape of the display device 100, may have a "⊏"-shaped (or "C"-shaped) cross-section at the first long side LS1 as illustrated in FIG. 3, and may have a rotated (or backwards) "L"-shape cross-section at the other sides LS2, SS1 and SS2 as illustrated in FIG. 4.

The upper cover portion 310_U of the case 310 may cover a portion of the upper surface of the frame 220 which is exposed by the display panel 210.

As described above with reference to FIGS. 1 through 8, the display device 100 can minimize the bezels at, for instance, three out of the four side surfaces through the backlight unit 230 (e.g., the backlight unit 230 including the light source 231 disposed on one side of the light guide plate 232). In this manner, the backlight unit 230 may be of an edge-type. In addition, the display device 100 can protect the connection film 211 and the circuit board 212 from an external force, static electricity, etc., by covering the connection film 211 and the circuit board 212 using the shield cover 250. Further, the shield cover 250 may be supported on the housing 240 by the coupling members (e.g., coupling member SCREW), and may additionally include the support member for supporting the shield cover 250 on the housing 240 at a side of the display device 100 (or at the side portion R3 of the shield cover 250). That is, since the shield cover 250 is supported at two points (or three points in consideration of the first and second lines LINE1 and LINE2) on the housing 240, it is possible to prevent the movement of the shield cover 250 in the vertical direction and the resultant failure of the display device 100.

Figure 9:
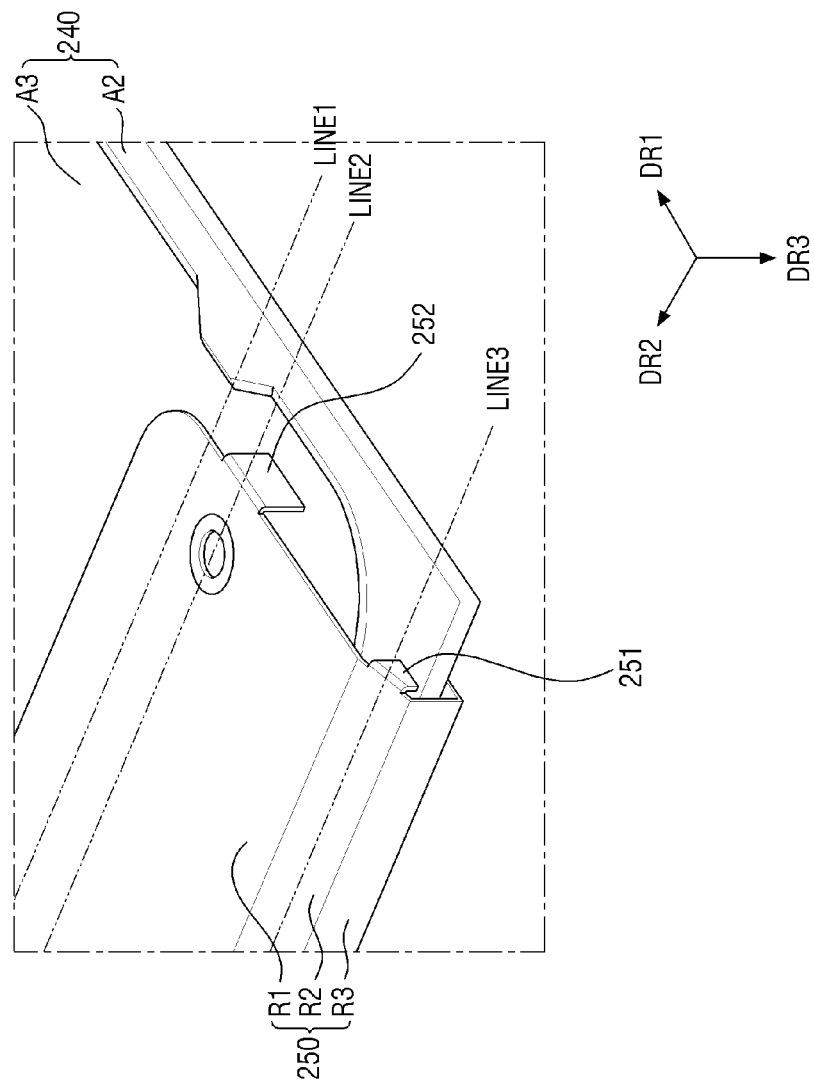
FIG. 9 is a perspective view of an example of the shield cover of FIG. 8 according to some exemplary embodiments.
Figure 10:
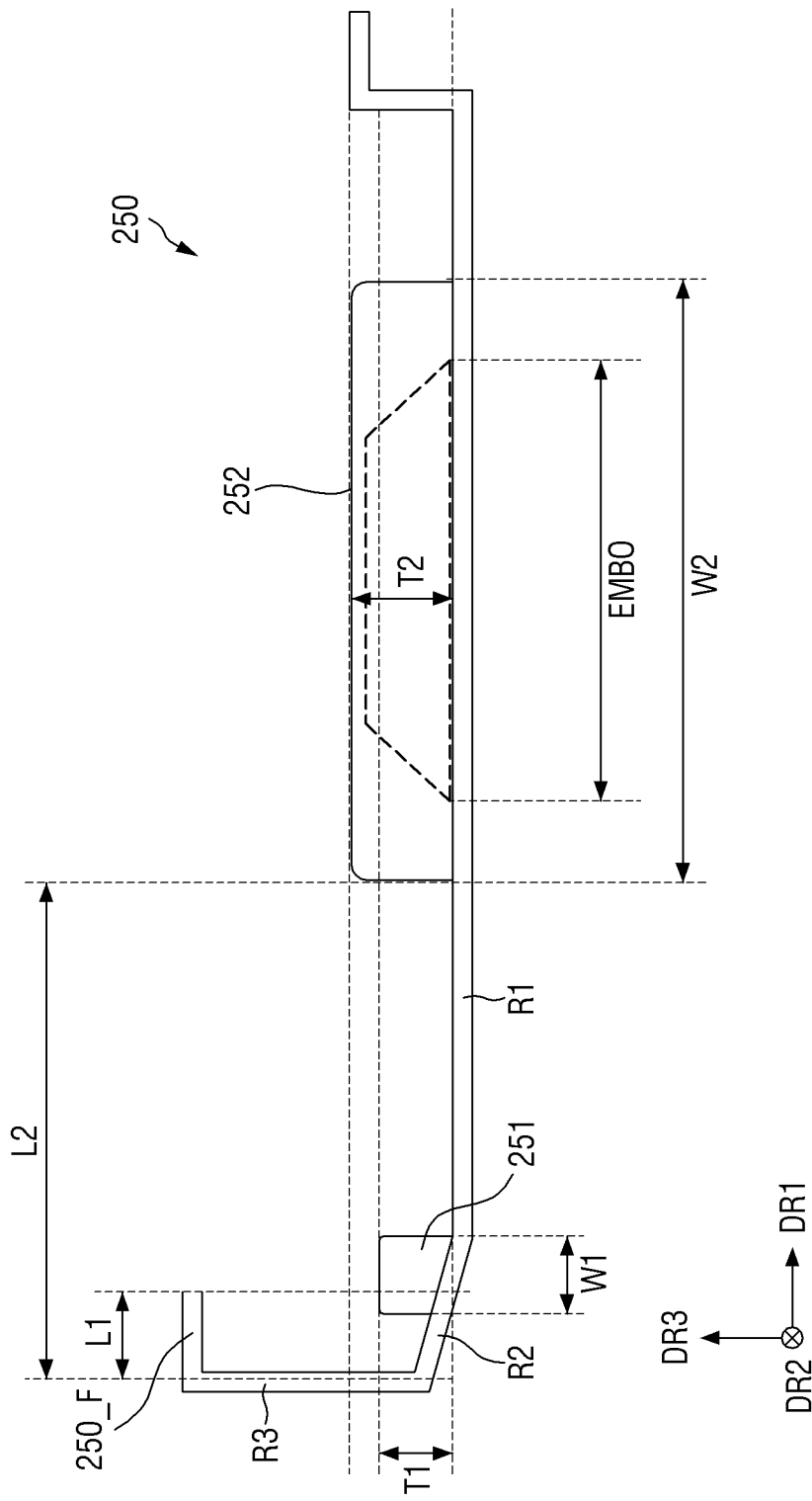
FIG. 10 is a cross-sectional view of the shield cover of FIG. 9 according to some exemplary embodiments.

FIG. 9 is a perspective view of an example of the shield cover 250 of FIG. 8 according to some exemplary embodiments. That is, FIG. 9 is an enlarged view of one side (e.g., the right side) of the first area A1 of the shield cover 250 illustrated in FIG. 8 according to some exemplary embodiments. FIG. 10 is a cross-sectional view of the shield cover 250 of FIG. 9 according to some exemplary embodiments.

Referring to FIGS. 9 and 10, the shield cover 250 may include at least one of a first support portion 251 and a second support portion 252.

The first support portion 251 may protrude from an end of an inclined portion R2 of the shield cover 250 toward the display panel 210. For example, the first support portion 251 may be formed by bending a side of the inclined portion R2 in an upward direction (that is, in the vertical direction (or the third direction DR3) toward the display panel 210).

A height T1 of the first support portion 251 may be equal to the distance from the shield cover 250 (or the inclined portion R2 of the shield cover 250) to the housing 240, and an end of the first support portion 251 may contact the housing 240 (or an edge portion A2 of the housing 240). In this case, the shield cover 250 may be supported on (or abut) the lower surface of the housing 240 by the first support portion 251. That is, the shield cover 250 may be supported at three points (or three lines) by including the first and second lines LINE1 and LINE2 described above and a third line LINE3 (e.g., a line passing through the center of the first support portion 251).

A width W1 of the first support portion 251 may be larger than the diameter of each coupling member (e.g., coupling member SCREW) described above with reference to FIG. 3, and may be equal to or greater than the diameter of the contact surface between each coupling portion EMBO of the housing 240 and a corresponding coupling portion of the shield cover 250. However, the configuration of the first support portion 251 is not limited to the aforementioned example.

The first support portion 251 may be spaced apart from the side portion R3 of the shield cover 250 by a distance smaller than a first distance L1. Here, the first distance L1 may be a width (or a length in the horizontal direction (or the first direction DR1)) of a fixing portion 250_F formed at an upper end of the side portion R3 of the shield cover 250. In this case, the housing 240 (and the frame 220) may be disposed between the fixing portion R3 of the shield cover 250 and the first support portion 251, and the movement of the shield cover 250 may be further reduced.

Like the first support portion 251, the second support portion 252 may protrude from an end of a bottom portion R1 of the shield cover 250 toward the display panel 210. For example, the second support portion 252 may be formed by bending a side of the bottom portion R1 in the upward direction (e.g., in the vertical direction (or the third direction DR3) toward the display panel 210).

A height T2 of the second support portion 252 may be equal to the distance from the shield cover 250 (or the bottom portion R1 of the shield cover 250) to the housing 240, and an end of the second support portion 252 may contact the housing 240 (or a central portion A3 of the housing 240). In this case, the shield cover 250 may be supported on (or abut) the lower surface of the housing 240 by the second support portion 252.

The height T2 of the second support portion 252 may be greater than the height T1 of the first support portion 251. As described above with reference to FIGS. 2, 3, and 6, the edge portion A2 of the lower surface of the housing 240 may protrude below the central portion A3. Therefore, the gap between the edge portion A2 and the shield cover 250 may be smaller than the gap between the central portion A3 and the shield cover 250.

A width W2 of the second support portion 252 may be equal to or greater than the diameter of the contact surface between each coupling portion EMBO of the housing 240 and a corresponding coupling portion of the shield cover 250. However, the configuration of the second support portion 252 is not limited to the aforementioned example. In this case, the distortion of the shield cover 250 can be prevented by the second support portion 252.

The second support portion 252 may be spaced apart from the side portion R3 of the shield cover 250 by a second distance L2. The second distance L2 may be smaller than the distance from the side portion R3 of the shield cover 250 to the coupling portions EMBO of the housing 240. That is, the second support portion 252 may be disposed further out than the coupling portions EMBO of the housing 240 with respect to the side portion R3 of the shield cover 250.

The second support portion 252 may not overlap a coupling portion EMBO of the housing 240 in a cross-sectional view. However, the second support portion 252 is not limited to the aforementioned example. For example, the second support portion 252 may partially overlap the coupling portion EMBO of the housing 240 in a cross-sectional view. In another example, the second support portion 252 may completely overlap the coupling portion EMBO of the housing 240 in a cross-sectional view, as illustrated in FIG. 10.

Although not illustrated, the shield cover 250 may further include third and fourth support portions formed on the other side (e.g., the left side) of the first area A1 illustrated in FIG. 8. The third and fourth support portions may be substantially identical to the first and second support portions 251 and 252, respectively. In a cross-sectional view, the third and fourth support portions may be arranged to correspond to (e.g., may be aligned with) the first and second support portions 251 and 252, respectively, or may be arranged alternately with the first and second support portions 251 and 252 with respect to, for instance, the first direction DR1. For example, at least part of the third support portion may not overlap the first support portion in a cross-sectional view.

As described above, since the shield cover 250 includes at least one of the first and second support portions 251 and 252, it may be supported at a plurality of points, e.g., two points, three points, etc., on the housing 240. Therefore, the movement of the shield cover 250 in the vertical direction, e.g., in the third direction DR3, can be prevented.

Figure 11:
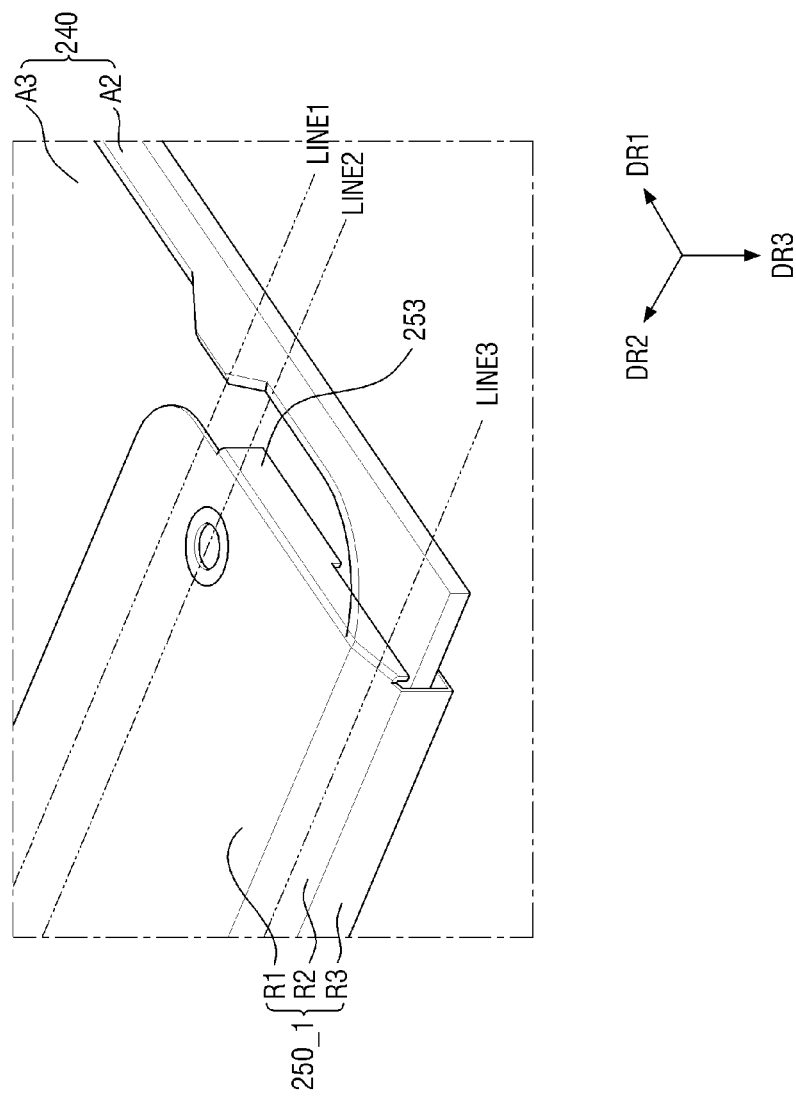
FIG. 11 is a perspective view of another example of a shield cover according to some exemplary embodiments.
Figure 12:
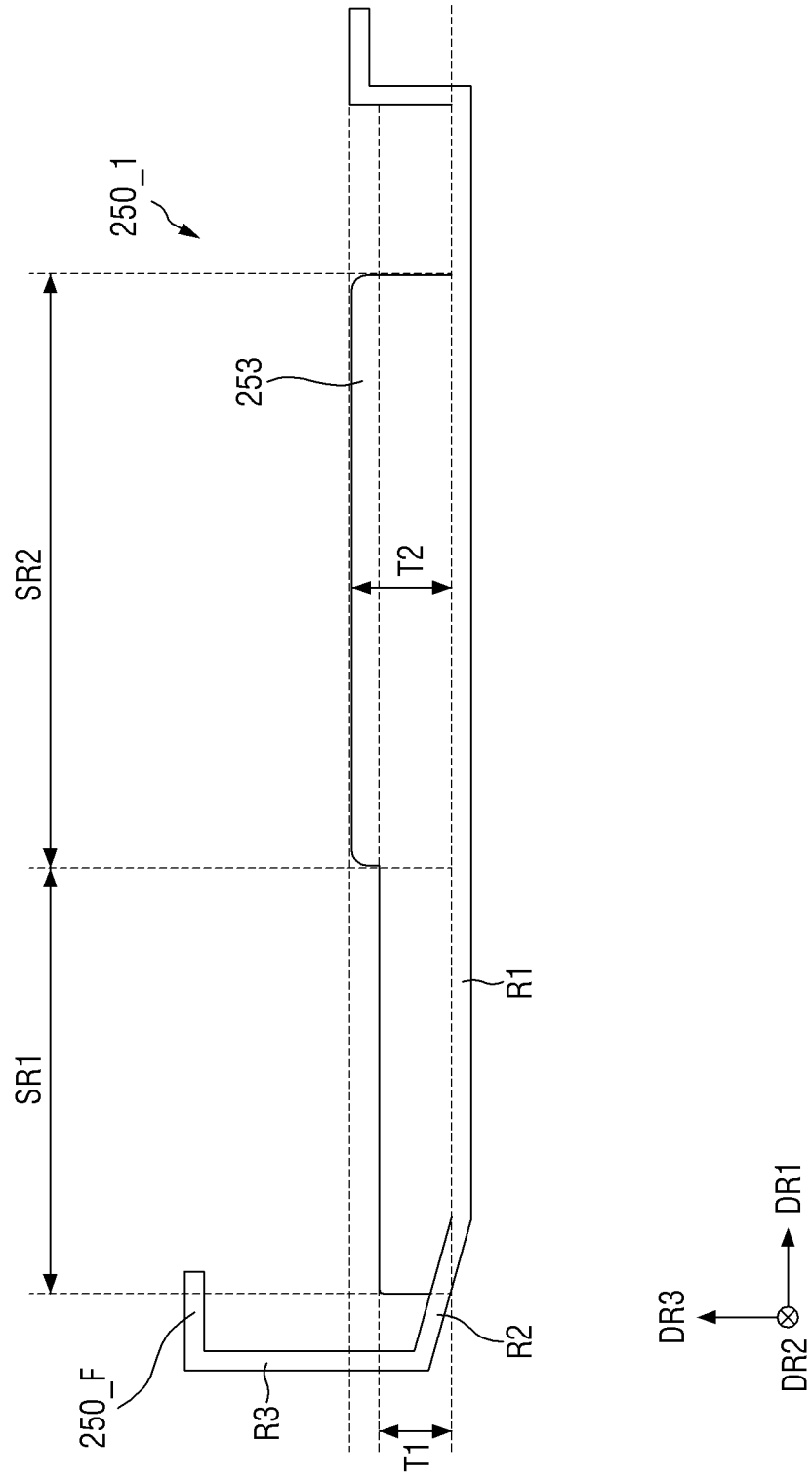
FIG. 12 is a cross-sectional view of the shield cover of FIG. 11 according to some exemplary embodiments.

FIG. 11 is a perspective view of another example of a shield cover 250_1 according to some exemplary embodiments. FIG. 12 is a cross-sectional view of the shield cover 250_1 of FIG. 11 according to some exemplary embodiments.

Referring to FIGS. 11 and 12, the shield cover 250_1 is different from the shield cover 250 of FIG. 9 in that it includes a third support portion 253. The third support portion 253 may protrude from a side portion (or end) of the shield cover 250_1 toward the display panel 210, similarly to the first and second support portions 251 and 252 of the shield cover 250.

The third support portion 253 may have a shape in which the first support portion 251 described with reference to FIG. 9 extends to the second support portion 252 and is integrated with the second support portion 252. That is, the third support portion 253 may have a first thickness T1 in a first section SR1 and a second thickness T2 in a second section SR2. A start point of the first section SR1 may be located at the distance (which is less than the first distance L1) of the first support portion 251 from the side portion R3 of the shield cover 250, and a start point of the second section SR2 may be located at the second distance L2 of the second support portion 252 from the side portion of the shield cover 250.

Figure 13:
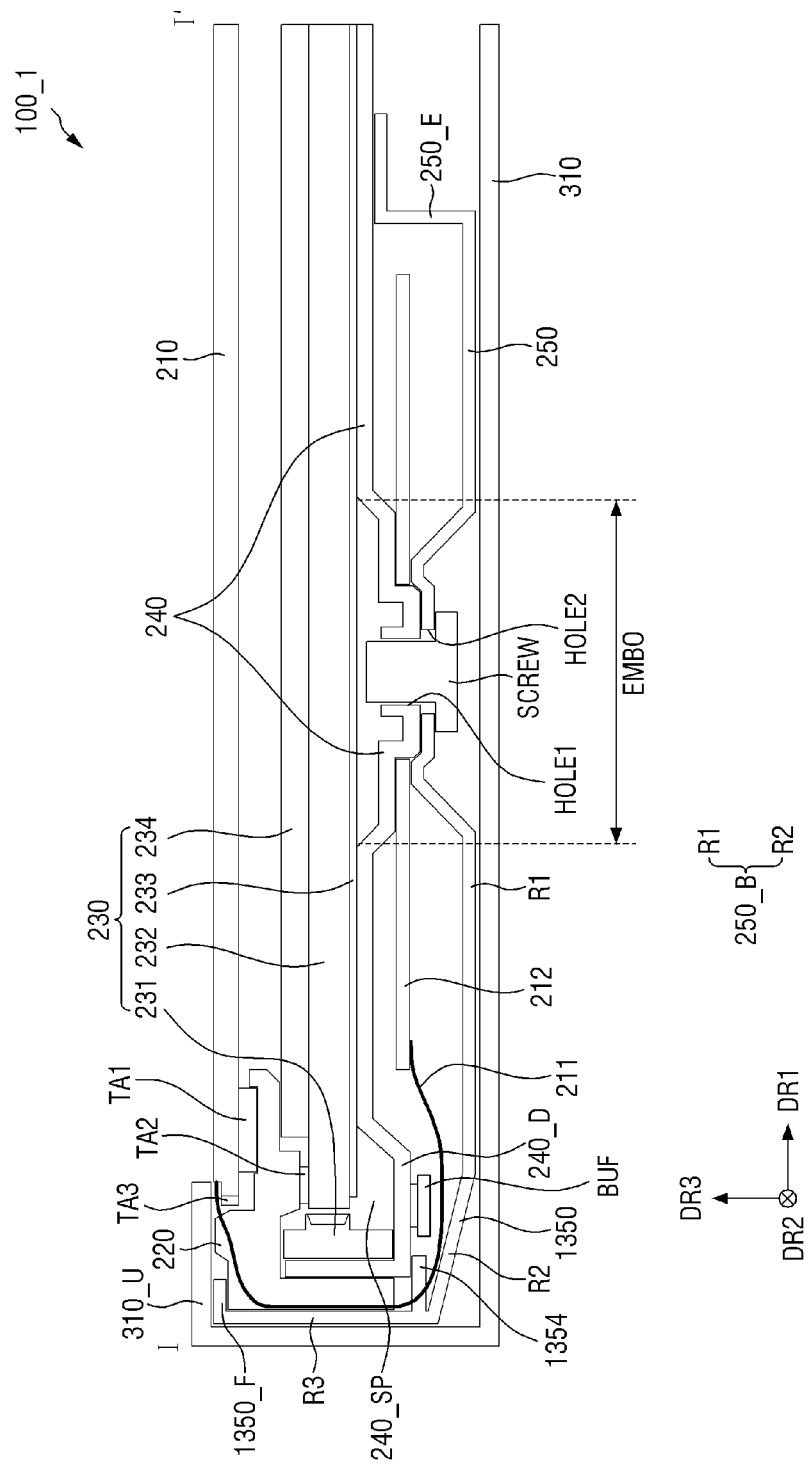
FIG. 13 is a cross-sectional view of a display device according to some exemplary embodiments.
Figure 14:
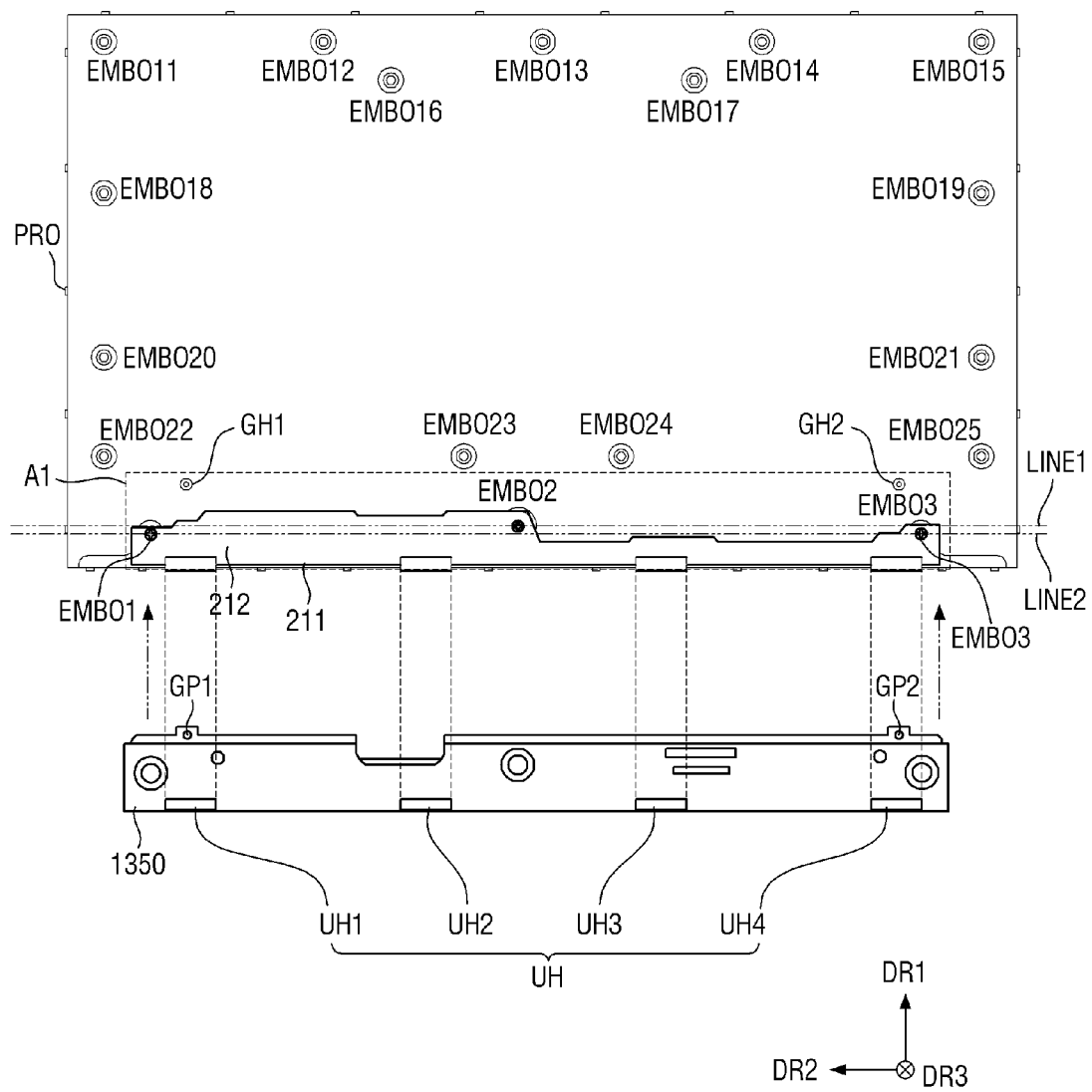
FIG. 14 illustrates a shield cover included in the display device of FIG. 13 according to some exemplary embodiments.
Figure 15:
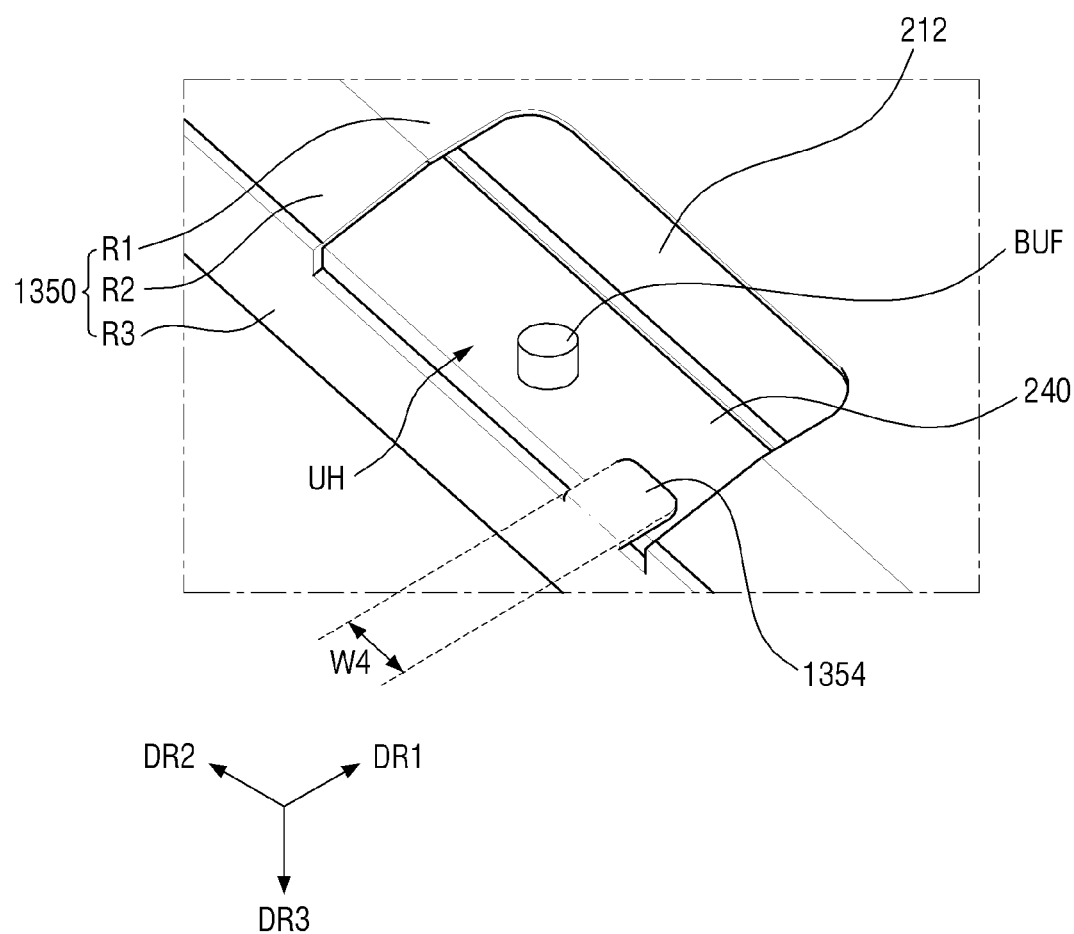
FIG. 15 illustrates an example of the shield cover of FIG. 14 according to some exemplary embodiments.
Figure 16:
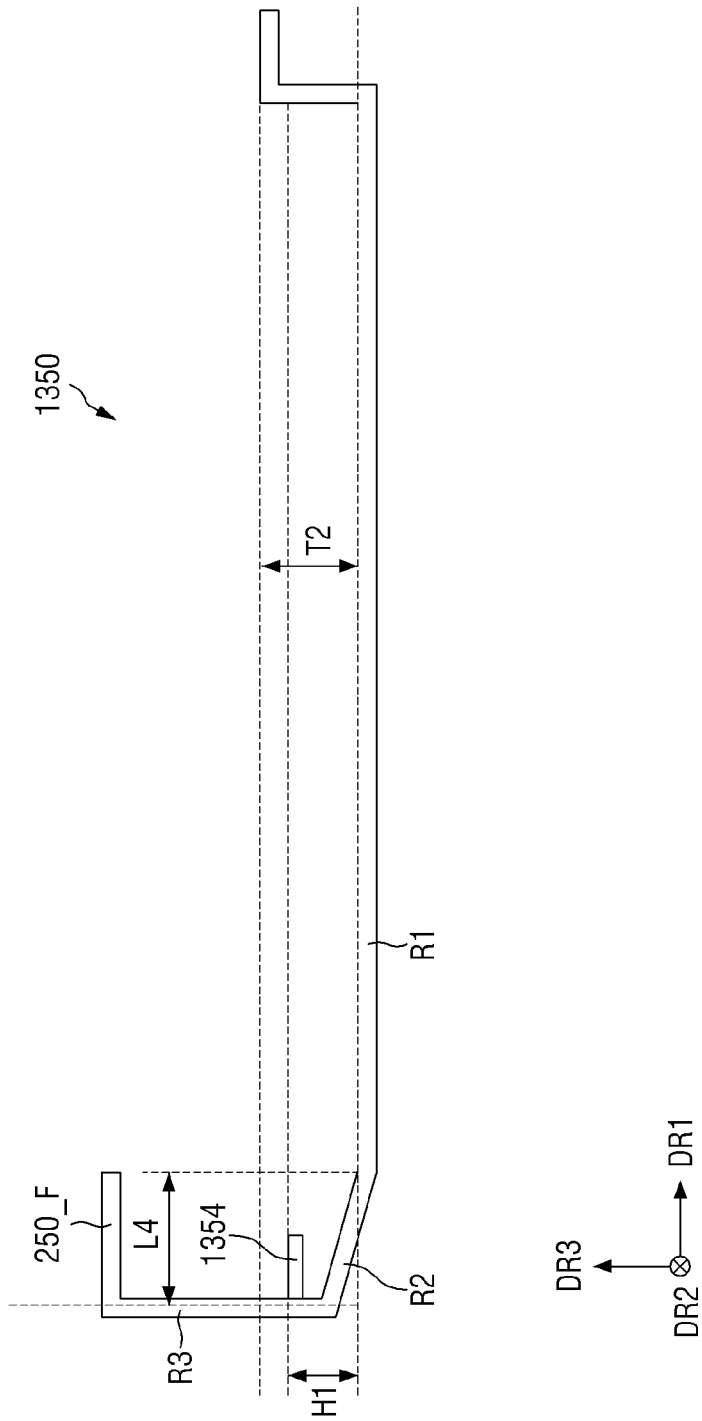
FIG. 16 is a cross-sectional view of the shield cover of FIG. 15 according to some exemplary embodiments.

FIG. 13 is a cross-sectional view of a display device 100_1 according to some exemplary embodiments. FIG. 14 illustrates a shield cover 1350 included in the display device 100_1 of FIG. 13 according to some exemplary embodiments. FIG. 15 illustrates an example of the shield cover 1350 of FIG. 14 according to some exemplary embodiments. FIG. 16 is a cross-sectional view of the shield cover 1350 of FIG. 15 according to some exemplary embodiments.

Referring to FIGS. 13 through 16, the display device 100_1 is different from the display device 100 of FIG. 3 in that it includes the shield cover 1350 and a buffer member BUF. Referring momentarily to FIG. 14, the shield cover 1350 is different from the shield cover 250 illustrated in FIG. 8 in that it includes user hole UH.

The user hole UH may be formed in a lower surface 1350_B of the shield cover 1350 (e.g., in a bottom portion R1 and an inclined portion R2 of the shield cover 1350 or the inclined portion R2 of the shield cover 1350) to penetrate the shield cover 1350 in a thickness direction. In some exemplary embodiments, a portion of the user hole UH may be formed in a side portion R3 of the shield cover 1350. The user hole UH may be formed to correspond to the holes (or the spaces between the sub-connection films) formed in the connection film 211 described above with reference to FIG. 2. For example, the shield cover 1350 may include four user holes UH1 through UH4. For ease of description, the four user holes UH1 through UH4 will be referred to as the user hole UH when their common features are described.

The buffer member BUF may be formed on a lower surface of a portion 240_D of the housing 240 exposed through each user hole UH. The buffer member BUF may be formed as a nut corresponding to a bolt (such as bolt BOLT of FIG. 20), and may be coupled to the lower surface of the portion 240_D of the housing 240. When the bolt passing through a case 310 is coupled to the buffer member BUF, one side of the housing 240 may be fixed to the case 310. The housing 240 may be supported more stably than the housing 240 described above with reference to FIG. 6.

For example, the buffer member BUF may be formed in at least one of a plurality of areas of the lower surface of the housing 240 that are exposed through the four user holes UH1 through UH4. In another example, a plurality of buffer members may be formed in one area of the housing 240 that is exposed through a user hole UH.

The shield cover 1350 may include a fourth support portion 1354 protruding from an edge of the user hole UH. The fourth support portion 1354 may be disposed below at least a portion of a fixing portion 1350_F of the shield member 1350. The fixing portion 1350_F may be configured similarly to the fixing portion 250_F of shield cover 250.

In the user hole UH of the shield cover 1350, the fourth support portion 1354 may protrude horizontally (e.g., in the first direction DR1) from an end of the inclined portion R2 (or the side portion R3) of the shield cover 1350 toward a display panel 210. For example, the fourth support portion 1354 may be formed by bending an end of the side portion R3 in the user hole UH in the horizontal direction (e.g., in a direction parallel to a lower surface of the display panel 210, such as in the first direction DR1).

A height H1 of the fourth support portion 1354 may be equal to the height of the lower surface of the housing 240 (e.g., an upper surface of the fourth support portion 1354 may lie in the same plane as the lower surface of the housing 240), and the upper surface of the fourth support portion 1354 may contact the housing 240 (or an edge portion A2 of the housing 240). In this case, the shield cover 1350 may be supported on (or abut) the lower surface of the housing 240 by the fourth support portion 1354. Therefore, the shield cover 1350 may be supported at three points (or three lines) as described above with reference to FIG. 9.

A width W4 of the fourth support portion 1354 may be greater than the diameter of each coupling member (e.g., coupling member SCREW) described above with reference to FIG. 3, and may be equal to or greater than the diameter of a contact surface between each coupling portion EMBO of the housing 240 and a corresponding coupling portion of the shield cover 1350. However, the configuration of the fourth support portion 1354 is not limited to the aforementioned example.

A length L4 of the fourth support portion 1354, like the width W4 of the fourth support portion 1354, may be greater than the diameter of each coupling member (e.g., coupling member SCREW), and may be equal to or greater than the diameter of the contact surface between each coupling portion EMBO of the housing 240 and a corresponding coupling portion of the shield cover 1350.

As described above, since the shield cover 1350 includes the fourth support portion 1354 formed in user hole UH, it may be supported at a plurality of points, e.g., two points, three points, etc., on the housing 240. Therefore, the movement of the shield cover 1350 in the vertical direction, e.g., in the third direction DR3, can be prevented. In addition, since the case 310 may be coupled to the housing 240 by the buffer member BUF formed on the lower surface of the portion 240_D of the housing 240 exposed through user hole UH, the housing 240 can be supported more stably.

FIG. 17 illustrates another example of a shield cover according to some exemplary embodiments.

Referring to FIG. 17, a shield cover 1750 is different from the shield cover 1350 of FIG. 15 in that it further includes a fifth support portion 1355. The shield cover 1750 may be substantially the same as the shield cover 1350 of FIG. 15, except for the fifth support portion 1355, and thus, a redundant description will not be repeated. Further, the fifth support portion 1355 may be substantially the same as the first support portion 251, except for the position, and thus, a redundant description will not be repeated.

In user hole UH of the shield cover 1750, the fifth support portion 1355 may protrude from an end of an inclined portion R2 (or a side portion R3) toward the display panel 210. For example, the fifth support portion 1355 may be formed by bending a side of the inclined portion R2 in user hole UH in the upward direction (e.g., in the vertical direction (or in the third direction DR3) toward the display panel 210). The cross-section of the shield cover 1750 including the fifth support portion 1355 may be substantially the same as the cross-section of the shield cover 250 illustrated in FIG. 10.

As described above, since the shield cover 1750 includes the fifth support portion 1355 formed in user hole UH, the movement of the shield cover 1750 in the vertical direction (e.g., in the third direction DR3) can be prevented.

Although the shield cover 1750 has been described as including the fifth support portion 1355, it is not limited to this example. For example, the shield cover 1750 may further include at least one of the first support portion 251, the second support portion 252, the third support portion 253, and the fourth support portion 1354 described above with reference to FIGS. 9 through 12 and 15.

Figure 19:
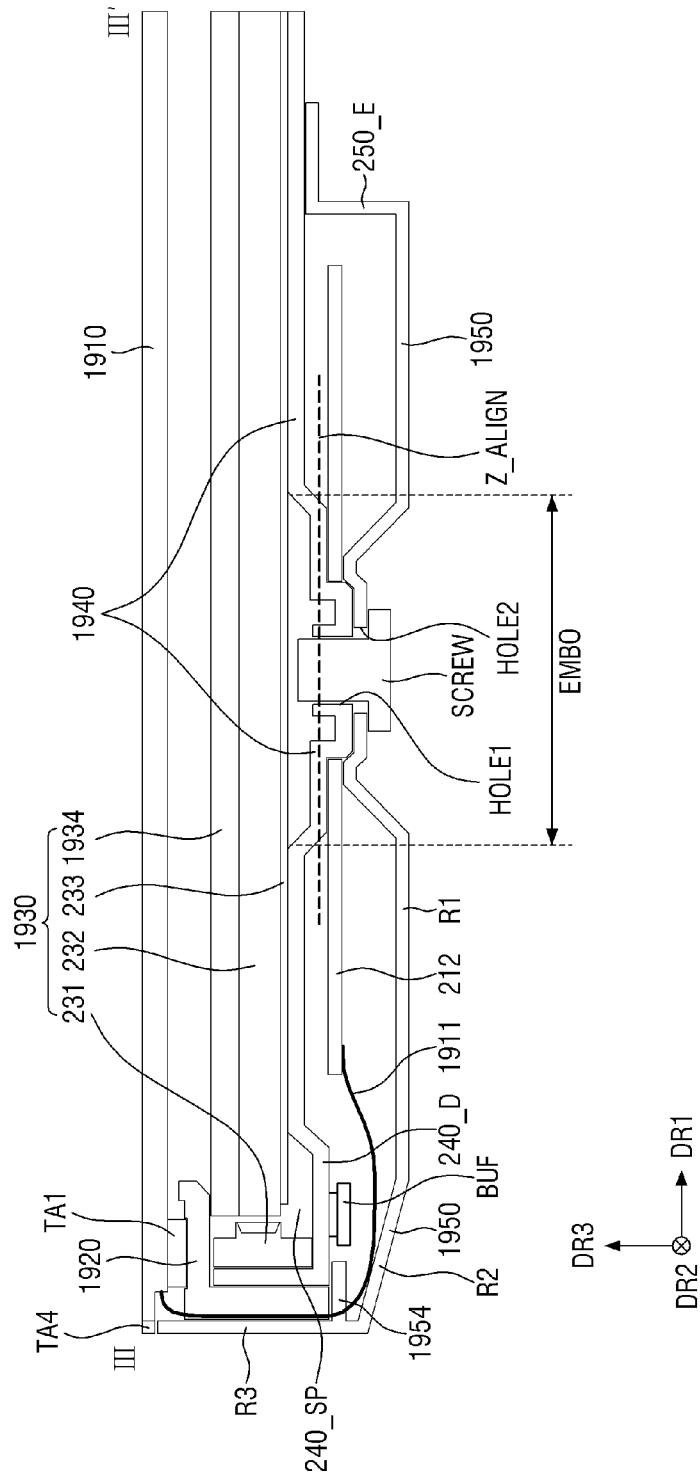
FIG. 19 is a cross-sectional view taken along sectional line III-III' of FIG. 18 according to some exemplary embodiments.

FIG. 18 is a perspective view of a display device 100_2 according to some exemplary embodiments. FIG. 19 is a cross-sectional view taken along sectional line III-III' of FIG. 18 according to some exemplary embodiments. FIG. 20 is a cross-sectional view taken along sectional line IV-IV' of FIG. 18 according to some exemplary embodiments.

Referring to FIGS. 18 through 20, the display device 100_2 is different from the display device 100 of FIG. 1 in that it has similar bezels at four sides.

As illustrated in FIG. 18, the display device 100_2 may include bezels of similar thicknesses at first and second long sides LS1_1 and LS2 and at first and second short sides SS1 and SS2. The thicknesses (or widths) of the bezels at the first and second long sides LS1_1 and LS2 and at the first and second short sides SS1 and SS2 may be equal to each other and may be equal to the thickness of sidewalls of a first case 2010, which will be described later.

The display device 100_2 may include a display panel 1910, a frame 1920, a backlight unit 1930, a housing 1940, and a shield cover 1950. In addition, the display device 100_2 may further include the first case 2010 and a second case 2020.

The display panel 1910, the frame 1920, the backlight unit 1930, the housing 1940, and the shield cover 1950 may be substantially the same as or similar to the display panel 210, the frame 220, the backlight unit 230, the housing 240, and the shield cover 250 described above with reference to FIGS. 1 through 8, except for the shapes on the first long side LS1_1 of the display device 100_2. Therefore, a redundant description will not be repeated. That is, the cross-section of the display device 100_2 cut along the sectional line III-III' of FIG. 18 may be substantially the same as the cross-section illustrated in FIG. 4, and the cross-section of the display device 100_2 on the first and second short sides SS1 and SS2 may also be substantially the same as the cross-section illustrated in FIG. 4.

As illustrated in FIG. 19, the backlight unit 1930 is different from the backlight unit 230 described above with reference to FIGS. 1 through 3 in that it includes an optical sheet 1934. The optical sheet 1934 may be disposed on an upper surface of a light guide plate 232. The optical sheet 1934 may have a size similar to the size (or area) of the upper surface of the light guide plate 232 in a plan view and may completely overlap the entire upper surface of the light guide plate 232 to completely cover the upper surface of the light guide plate 232. In this case, on the first long side LS1_1 of the display device 100_2, an outer surface of the optical sheet 1934 may lie in the same plane as an outer surface of the light guide plate 232 (e.g., the outer surfaces may coincide with each other).

The frame 1920 may be disposed on the backlight unit 1930 and the housing 1940, and may cover part of an upper surface of the housing 1940 and at least part of side surfaces of the housing 1940. The frame 1920 may completely cover a light source 231 of the backlight unit 1930, but may expose most of an upper surface of the optical sheet 1934 of the backlight unit 1930 through an opening, which may be similar to the opening OP in frame 220 of FIG. 2. In this case, the frame 1920 may not directly contact the light guide plate 232.

The display panel 1910 may have a size substantially equal or similar to the size of the outer periphery of the frame 1920, may be disposed on the frame 1920, and may completely cover the frame 1920 and an exposed upper surface of the backlight unit 1930 (e.g., a portion exposed through the opening of the frame 1920).

A first support member TA1 may be disposed between the display panel 1910 and the frame 1920. The first support member TA1, like the first support member TA1 described above with reference to FIG. 3, may be disposed along edges of the display panel 1910 and may not overlap the upper surface of the backlight unit 1930 exposed by the opening of the frame 1920. A side (e.g., the first long side LS1_1) of the display panel 1910 may be connected to a circuit board 212 by a connection film 1911. Here, the connection film 1911 may be substantially the same as the connection film 211 described above with reference to FIGS. 2 and 3, except for the connection relationship with the display panel 1910.

As illustrated in FIG. 19, the display panel 1910 may have a bottom emission structure. In this case, a pad portion (e.g., a pad portion in which pads for connecting internal wirings to an external device are disposed) may be disposed on a lower surface of the display panel 1910. An end of the connection film 1911 may be connected to the lower surface of one side (e.g., the pad portion) of the display panel 1910, and the other end of the connection film 1911 may be attached to the circuit board 212.

A fourth support member TA4 (e.g., an adhesive member, a sticky member, or the like) may be disposed on side surfaces of the display panel 1910 along the side surfaces of the display panel 1910. The fourth support member TA4 may be disposed between the side surfaces of the display panel 1910 and sidewalls of the housing 1940 (or the first case 2010 to be described later) to seal the space between them.

Accordingly, the entire upper surface of the display panel 1910 may be exposed to form an upper surface (or a front surface) of the display device 100_2. In addition, the width of bezels visible on the upper surface of the display device 100_2 may be equal or similar to the sum of the thickness of the sidewalls of the first case 2010 and the width of the fourth support member TA4.

The shield cover 1950 may be substantially the same as the shield cover 1350 described above with reference to FIGS. 13 through 17. That is, the shield cover 1950 may include a user hole UH (see, e.g., FIG. 15). A buffer member BUF may be disposed on a portion 240_D of a lower surface of the housing 1920 exposed by the user hole UH, and a bolt BOLT penetrating the first case 2010 may pass through the user hole UH to be inserted and coupled to the buffer member BUF, as illustrated in FIG. 20.

The shield cover 1950 may include a fourth support portion 1954, and the fourth support portion 1954 may be substantially the same as the fourth support portion 1354 described above with reference to FIGS. 15 and 16. In addition, the shield cover 1950 may further include the fifth support portion 1355 described above with reference to FIG. 17. That is, the shield cover 1950 may include support portions protruding from edges of user hole UH toward the display panel 1910 to support the lower surface of the housing 1940.

Further, the shield cover 1950 may include or further include at least one of the first through third support portions 251, 252, and 253 described above with reference to FIGS. 9 through 12. That is, the shield cover 1950 may include a support portion protruding from an outermost side surface of the shield cover 1950 toward the display panel 1910 to support the lower surface of the housing 1940.

As illustrated in FIG. 20, the first case 2010 may include a bottom and sidewalls extending upward (e.g., in the third direction DR3) from edges of the bottom. Although not shown in FIG. 20, the display panel 1910 may be accommodated in a space defined by the bottom and the sidewalls of the first case 2010. On the first long side LS1_1 of the display device 100_2, the bolt BOLT may pass through the first case 2010 and the shield cover 1950 (or the user hole UH of the shield cover 1950) to be coupled to the buffer member BUF formed on the lower surface of the housing 1940. For illustrative convenience, the shield cover 1950 is not shown in FIG. 20. Therefore, the first case 2010 can be more firmly coupled to the housing 1940 on the first long side LS1_1 of the display device 100_2. On the second long side LS2 of the display device 100_2, the bolt BOLT may pass through the first case 2010 to be coupled to the housing 1940.

The second case 2020 may have a quadrilateral plate shape, may have the same size as the planar size of the first case 2010, and may be disposed on a lower surface of the first case 2010. The second case 2020 may be coupled to the first case 2010 by interference fit (such as via friction) or engagement without using coupling members (e.g., the bolts BOLT).

As described above, since the display panel 1910 of the bottom emission structure disposed on the front surface of the display device 100_2 and is supported by the frame 1920, the bezels at sides (e.g., the four sides) of the display device 100_2 can be minimized. In addition, at the first long side LS1_1 of the display device 100_2 (e.g., at a portion overlapping the shield cover 1950), the first case 2010 can be more firmly coupled to the housing 1940 by the bolt BOLT coupled to the buffer member BUF through user hole UH. Further, since the shield cover 1950 includes at least one of the support portions formed in user hole UH and the support portions formed on the outermost side surface, the movement of the shield cover 1950 in the vertical direction, e.g., in the third direction DR3, can be prevented.

According to various exemplary embodiments, bezels of a display device can be minimized at, for instance, three out of four sides through an edge-type backlight unit. In addition, since a connection film and a circuit board can be covered with a shield cover, failures due to an external force and static electricity can be prevented. Further, the shield cover may be supported at a number of points (e.g., two points, three points, etc.) on a housing (or a display module) by coupling portions, support portions, etc. This can prevent the movement of the shield cover in the vertical direction and the resultant failure of the display device. Therefore, product stability can be improved. It is noted, however, that the effects of the inventive concepts are not limited by the foregoing, and other various effects are anticipated herein.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
    a display module comprising a display panel;
    a circuit board disposed under a lower surface of the display module;
    a connection film electrically connecting the circuit board to a first side of the display panel; and
    a shield cover comprising:
        a body portion disposed under the circuit board such that the circuit board is disposed between the display panel and the body portion;
        a side portion extending in an upward direction from a first side of the body portion along a first side surface of the display module, the first side surface of the display module being adjacent to the first side of the display panel; and
        a first support portion protruding in the upward direction from a second side of the body portion adjacent to the first side of the body portion, the first support portion contacting the lower surface of the display module,
    wherein the connection film is disposed between the lower surface of the display module and the shield cover.

2. The display device of claim 1, wherein:
    the connection film comprises an end directly connected to an upper surface of the display panel adjacent to the first side of the display panel and bent in a downward direction such that another end of the connection film is directly connected to the circuit board; and
    the shield cover covers at least part of the connection film and the circuit board.

3. The display device of claim 2, wherein:
    the display module further comprises:
        a backlight unit configured to emit light; and
        a frame comprising an opening at a central portion, the frame being disposed on the backlight unit, the display panel is disposed on the frame;

the frame comprises concave portions formed in a side surface of the frame, the grooves extending from an upper surface of the frame to a lower surface of the frame; and the connection film is disposed along the grooves of the frame.

4. The display device of claim 1, wherein:

the display module further comprises:
   a backlight unit configured to emit light; and
   a frame comprising an opening at a central portion, the frame being disposed on the backlight unit;

a first width from a first side of the frame to the opening is greater than a second width from a second side of the frame to the opening; and the display panel is disposed on the frame and is coupled to the frame via a first support member disposed between a lower surface of the display panel and an upper surface of the frame, the first support member extending along edges of the display panel.

5. The display device of claim 4, wherein:

the backlight unit comprises:
   a light guide plate;
   a light source disposed between a first side surface of the light guide plate and the first side surface of the display module;
   a reflective sheet disposed on a lower surface of the light guide plate; and
   an optical sheet disposed on an upper surface of the light guide plate such that the light guide plate is disposed between the optical sheet and the reflective sheet, the optical sheet being spaced apart from the first side surface of the light guide plate; and the frame further comprises a second support member disposed between the upper surface of the light guide plate and the frame, a portion of the upper surface of the light guide plate being exposed by the optical sheet.

6. The display device of claim 5, wherein:

the frame further comprises a portion protruding upward along edges of the upper surface of the frame; and the display panel is coupled to the portion of the frame by an adhesive member disposed between side surfaces of the display panel and the portion of the frame.

7. The display device of claim 4, wherein:

the display module further comprises a housing;

the housing comprises:
   a bottom disposed under the backlight unit; and
   sidewalls extending in the upward direction from edges of the bottom, the sidewalls contacting side surfaces of the backlight unit;

upper ends of the sidewalls of the housing comprise grooves extending in a downward direction opposite the upward direction;

the optical sheet comprises projections protruding in a horizontal direction from edges of the optical sheet, the horizontal direction crossing the upward direction; and the projections of the optical sheets interface with the grooves of the sidewalls of the housing.

8. The display device of claim 7, wherein:

the housing comprises a first coupling portion protruding in the downward direction from a lower surface of the housing, the first coupling portion comprising a first coupling hole overlapping the central portion of the frame;

the circuit board comprises a hole corresponding to the first coupling hole;

the shield cover comprises a second coupling portion protruding in the upward direction from the body portion in correspondence with the first coupling portion of the housing, the second coupling portion comprising a second coupling hole corresponding to the first coupling hole; and the housing, the circuit board, and the shield cover are fixed to each other via a coupling member passing through the second coupling hole in the shield cover, the hole in the circuit board, and the first coupling hole in the housing.

9. The display device of claim 8, wherein:

the hole in the circuit board is larger than each of the first coupling hole in the housing and the second coupling hole in the shield cover; and the second coupling portion of the shield cover partially contacts the first coupling portion of the housing through the hole in the circuit board.

10. The display device of claim 1, wherein:

the shield cover further comprises a fixing portion extending in a horizontal direction from an upper end of the side portion, the fixing portion contacting an upper surface of the display module; and the horizontal direction is perpendicular to the upward direction.

11. The display device of claim 1, wherein the first support portion is a bent portion of an end of the second side of the body portion.

12. The display device of claim 1, wherein the shield cover further comprises a coupling portion protruding from a central portion of the body portion in the upward direction, the coupling portion contacting a lower surface of the circuit board.

13. The display device of claim 12, wherein the first support portion is more adjacent to the first side of the body portion than the coupling portion.

14. The display device of claim 12, wherein:

the body portion of the shield cover comprises:
   a bottom portion parallel to the display panel; and
   an inclined portion extending from a first side of the bottom portion in a diagonal direction, the inclined portion being connected to the side portion;

the diagonal direction forms an obtuse angle with the bottom portion;

the coupling portion protrudes from the bottom portion; and the first support portion protrudes from the inclined portion.

15. The display device of claim 14, wherein:

the shield cover further comprises a second support portion protruding in the upward direction from the second side of the body portion; and the second support portion is connected to the bottom portion.

16. The display device of claim 12, wherein:

the body portion of the shield cover comprises:
   a bottom portion parallel to the display panel, and
   an inclined portion extending from a first side of the bottom portion in a diagonal direction, the inclined portion being connected to the side portion;

the diagonal direction forms an obtuse angle with the bottom portion;

the coupling portion protrudes from the bottom portion; and the first support portion protrudes from the bottom portion and contacts the inclined portion.

17. The display device of claim 12, wherein:
at least part of a third side of the body portion of the shield cover is bent in the upward direction, the at least part of the third side of the body portion contacting the lower surface of the display module; and
the third side faces the first side of the body portion.

18. The display device of claim 1, wherein:
the shielding cover further comprises:
a user hole adjacent to the side portion and partially exposing the lower surface of the display module; and
a third support portion protruding from a first edge of the user hole in a horizontal direction, the third support portion contacting the lower surface of the display module;
the horizontal direction is perpendicular to the upward direction; and
the first edge of the user hole is adjacent to the side portion and is parallel to the side portion.

19. The display device of claim 18, wherein the shield cover further comprises a fourth support portion protruding from a second edge adjacent to the first edge of the user hole, the fourth support portion protruding in the upward direction and contacting the lower surface of the display module.

20. The display device of claim 1, wherein:
the shield cover further comprises:
a user hole adjacent to the side portion and partially exposing the lower surface of the display module; and
a fourth support portion protruding from a second edge of the user hole in the upward direction, the fourth support portion contacting the lower surface of the display module; and
the second edge is adjacent to the side portion and perpendicular to the side portion.

21. A display device comprising:
a display module comprising a display panel;
a circuit board disposed under the display module and connected to a first side of the display panel; and
a shield cover covering at least part of a first side surface of the display module and the circuit board, the shield cover comprising:
a body portion disposed under the circuit board such that the circuit board is disposed between the display panel and the body portion;
a side portion extending in an upward direction from a first side of the body portion along a first side surface of the display module, the first side surface of the display module being adjacent to the first side of the display panel;
a user hole adjacent to the side portion and partially exposing a lower surface of the display module; and
a first support portion protruding in a horizontal direction from a first edge of the user hole, the first support portion contacting the lower surface of the display module,
wherein the horizontal direction is perpendicular to the upward direction, and
wherein the first edge of the user hole is adjacent to the side portion and parallel to the side portion.

22. The display device of claim 21, further comprising:
a connection film comprising an end directly connected to a lower surface of the display panel adjacent to the first side of the display panel and bent in a downward direction such that another end of the connection film is directly connected to the circuit board,
wherein the shield cover covers at least part of the connection film and the circuit board.

23. The display device of claim 21, wherein:
the display module further comprises:
a backlight unit configured to emit light; and
a frame comprising an opening in a central portion, the frame being disposed on the backlight unit;
the display panel is disposed on the frame and coupled to the frame via a first support member disposed between a lower surface of the display panel and an upper surface of the frame, the first support member extending along edges of the display panel;
the backlight unit comprises:
a light guide plate;
a light source disposed between a first side surface of the light guide plate and the first side surface of the display module;
a reflective sheet disposed on a lower surface of the light guide plate; and
an optical sheet disposed on an upper surface of the light guide plate such that the light guide plate is disposed between the optical sheet and the reflective sheet; and
a first side surface of the optical sheet lies in a same plane as the first side surface of the light guide plate.

24. The display device of claim 21, wherein the first support portion is a bent portion of an end of the side portion, the first support portion extending into the user hole.

25. The display device of claim 21, wherein:
the shield cover further comprises a second support portion protruding from a second edge of the user hole in the upward direction, the second support portion contacting the lower surface of the display module; and
the second edge of the user hole is adjacent to the first edge and perpendicular to the side portion.

26. The display device of claim 25, wherein:
the shield cover further comprises a coupling portion protruding from a central portion of the body portion in the upward direction, the coupling portion contacting a lower surface of the circuit board; and
the second support portion is more adjacent to the first side of the body portion than the coupling portion.

27. The display device of claim 26, wherein:
the body portion of the shield cover comprises:
a bottom portion parallel to the display panel; and
an inclined portion extending from a first side of the bottom portion in a diagonal direction, the inclined portion being connected to the side portion;
the diagonal direction forms an obtuse angle with the bottom portion;
the coupling portion protrudes from the bottom portion; and
the second support portion protrudes from the inclined portion.

28. A display device comprising:
a display module comprising a display panel;
a circuit board disposed under the display module and connected to a first side of the display panel; and
a shield cover covering at least part of a first side surface of the display module and the circuit board, the shield cover comprising:
a body portion disposed under the circuit board such that the circuit board is disposed between the display panel and the body portion;
a side portion extending in an upward direction from a first side of the body portion along a first side surface of the display module, the first side surface of the display module being adjacent to the first side of the display panel;

a user hole adjacent to the side portion and partially exposing a lower surface of the display module; and a first support portion protruding in the upward direction from a first edge of the user hole, the first support portion contacting the lower surface of the display module, wherein the first edge of the user hole is adjacent to the side portion and perpendicular to the side portion.

29. The display device of claim 28, wherein:

the shield cover further comprises a coupling portion protruding from a central portion of the body portion in the upward direction, the coupling portion contacting a lower surface of the circuit board; and the first support portion is more adjacent to the first side of the body portion than the coupling portion.

30. The display device of claim 29, wherein:

the body portion of the shield cover comprises:
a bottom portion parallel to the display panel; and
an inclined portion extending from a first side of the bottom portion in a diagonal direction, the inclined portion being connected to the side portion;

the diagonal direction forms an obtuse angle with the bottom portion;

the coupling portion protrudes from the bottom portion; and the first support portion protrudes from the inclined portion.

* * * * *